United States Patent
Lee et al.

(10) Patent No.: US 9,853,481 B2
(45) Date of Patent: Dec. 26, 2017

(54) METHOD FOR DETECTING LOAD IN WIRELESS CHARGING PRIORITY

(71) Applicant: Samsung Electronics Co., Ltd., Gyeonggi-do (KR)

(72) Inventors: Kyung-Woo Lee, Seoul (KR); Chong-Min Lee, Seoul (KR); Hee-Won Jung, Gyeonggi-do (KR); Keum-Su Song, Seoul (KR)

(73) Assignee: Samsung Electronics Co., Ltd (KR)

( * ) Notice: Subject to any disclaimer, the term of this patent is extended or adjusted under 35 U.S.C. 154(b) by 232 days.

(21) Appl. No.: 14/626,500

(22) Filed: Feb. 19, 2015

(65) Prior Publication Data
US 2015/0233990 A1    Aug. 20, 2015

(30) Foreign Application Priority Data

Feb. 19, 2014    (KR) .......................... 10-2014-0019355

(51) Int. Cl.
| | | |
|---|---|---|
| *H02J 17/00* | (2006.01) | |
| *H02J 7/02* | (2016.01) | |
| *G01R 21/133* | (2006.01) | |
| *H02J 7/00* | (2006.01) | |
| *H02J 50/10* | (2016.01) | |
| *H02J 50/80* | (2016.01) | |
| *G01R 19/165* | (2006.01) | |

(52) U.S. Cl.
CPC ............ *H02J 7/025* (2013.01); *G01R 21/133* (2013.01); *H02J 7/0054* (2013.01); *H02J 50/10* (2016.02); *H02J 50/80* (2016.02); *G01R 19/16538* (2013.01)

(58) Field of Classification Search
CPC .................................. H02J 17/00; H02J 5/005
USPC ......................................................... 207/104
See application file for complete search history.

(56) References Cited

U.S. PATENT DOCUMENTS

| | | | |
|---|---|---|---|
| 2011/0148221 A1 | 6/2011 | Trotter et al. | |
| 2012/0161538 A1 | 6/2012 | Kinoshita et al. | |
| 2012/0306269 A1 | 12/2012 | Kim et al. | |
| 2013/0020879 A1 | 1/2013 | Kihara et al. | |
| 2013/0069441 A1* | 3/2013 | Verghese ............... | G01R 33/10 307/104 |
| 2013/0154557 A1 | 6/2013 | Lee et al. | |

(Continued)

FOREIGN PATENT DOCUMENTS

| | | |
|---|---|---|
| EP | 2 874 276 | 5/2015 |
| KR | 10-2013-0098649 | 9/2013 |
| WO | WO 2014/010951 | 1/2014 |

OTHER PUBLICATIONS

International Search Report dated May 13, 2015 issued in counterpart applicaton No. PCT/KR2015/001621.

(Continued)

*Primary Examiner* — Daniel Cavallari
(74) *Attorney, Agent, or Firm* — The Farrell Law Firm, P.C.

(57) ABSTRACT

A method for detecting a load in wireless charging is provided. The method includes storing predetermined transmission signal waveform information, transmitting a signal according to the predetermined transmission signal waveform information, detecting a waveform change in the transmitted signal, and determining whether a device exists based on the detected waveform change.

20 Claims, 16 Drawing Sheets

(56) References Cited

U.S. PATENT DOCUMENTS

2015/0180268 A1   6/2015  Byun et al.
2015/0341087 A1*  11/2015 Moore ................. H04B 5/0031
                                                                455/77

OTHER PUBLICATIONS

European Search Report dated Oct. 26, 2017 issued in counterpart applicaton No. 15751748.3-1804, 11 pages.

* cited by examiner

METHOD FOR DETECTING LOAD IN WIRELESS CHARGING PRIORITY

PRIORITY

This application claims priority under 35 U.S.C. §119(a) to Korean Patent Application Serial No. 10-2014-0019355, which was filed in the Korean Intellectual Property Office on Feb. 19, 2014, the entire disclosure of which is incorporated herein by reference.

BACKGROUND OF THE INVENTION

1. Field of the Invention

The present invention relates generally to wireless charging, and more particularly, to a method for detecting a load in a wireless power transmitter.

2. Description of the Related Art

In view of their nature, mobile terminals such as portable phones and Personal Digital Assistants (PDAs) are powered by rechargeable batteries. To charge the batteries, the mobile terminals apply electric energy to the batteries through chargers. Typically, the charger and the battery each have an exterior contact terminal (i.e., the contact terminals protrude outward) and thus are electrically connected to each other by contact between their contact terminals.

This contact-based charging scheme faces the problem of the contact terminals becoming contaminated with foreign materials, which can result in unreliable battery charging. Moreover, if the contact terminals are exposed to moisture, the batteries may not charge properly.

To address the above problem, wireless charging or contactless charging technologies have recently been developed and are applied to many electronic devices.

Such a wireless charging technology is based on wireless power transmission and reception. For example, once a portable phone is placed on a charging pad, without being connected to an additional charging connector, its battery is automatically charged. Among wirelessly charged products, wireless electric toothbrushes or wireless electric shavers are well known. This wireless charging technology offers the benefits of increased water-proofness due to the wireless charging of the electronic products and enhanced portability due to no need for a wired charger for electronic devices. Further, it is expected that various relevant wireless charging technologies will be more developed in the upcoming era of electric vehicles.

There are three wireless charging schemes largely: a) electromagnetic induction using coils, b) resonance-based, and c) Radio Frequency (RF)/microwave radiation based on conversion of electric energy to microwaves.

So far, the electromagnetic induction-based wireless charging scheme has been dominantly popular. However, considering recent successful experiments in wireless power transmission over microwaves at a distance of tens of meters, it is foreseeable that every electronic product will be charged cordlessly at any time in any place in the near future.

Electromagnetic induction-based power transmission means power transfer between primary and secondary coils. When a magnet moves through a coil, current is induced. Based on this principle, a transmitter creates a magnetic field and a receiver produces energy caused by current being induced by a change in the magnetic field. This phenomenon is called magnetic induction and power transmission based on magnetic induction is highly efficient in energy transfer.

Regarding resonance-based wireless charging, a system that makes wireless energy transfer from a charger at a distance of a few meters based on the resonance-based power transmission principle by the Coupled Mode Theory has been proposed. The MIT team resonated electromagnetic waves carry electric energy, instead of sound. The resonant electric energy is directly transferred only in the presence of a device having the same resonant frequency, while the unused electric energy is reabsorbed into the electromagnetic field rather than it is dispersed in the air. Thus the resonant electric energy does not affect nearby machines or human bodies, compared to other electronic waves.

Wireless charging is actively being researched. Thus, there is a need for developing a standard regarding wireless charging priority, detection of a wireless power transmitter/receiver, communication frequency selection between a wireless power transmitter and a wireless power receiver, wireless power control, selection of a matching circuit, and allocation of a communication time to each wireless power receiver in a single charging cycle.

Further, there is a need for a method for effectively detecting a load in a wireless power transmitter (that is, a Power Transmitting Unit (PTU)).

SUMMARY OF THE INVENTION

The present invention has been made to address at least the above-mentioned problems and/or disadvantages and to provide at least the advantages described below.

Accordingly, an aspect of the present invention is to provide a method for detecting a load in wireless charging in order to determine the presence or absence of a device by detecting a waveform change of transmission power in a wireless power transmitter.

Another aspect of the present invention is to provide a method for detecting a load in wireless charging in order to determine the type of a device by detecting a waveform change of transmission power in a wireless power transmitter.

Another aspect of the present invention is to provide a method for detecting a load in wireless charging in order to determine proximity or remoteness of a device by detecting a waveform change of transmission power in a wireless power transmitter.

Another aspect of the present invention is to provide a method for detecting a load in wireless charging in order to determine the type of an object or device placed on a wireless power transmitter by detecting an occurrence time of a waveform change of transmission power in a wireless power transmitter.

An aspect of the present invention provides a method for detecting a load in wireless charging. The method includes storing predetermined transmission signal waveform information, transmitting a signal according to the predetermined transmission signal waveform information, detecting a waveform change in the transmitted signal, and determining whether a device exists based on the detected waveform change.

An aspect of the present invention provides a method for detecting a load in wireless charging. The method includes storing predetermined transmission signal waveform information, transmitting a signal according to the predetermined transmission signal waveform information, detecting a waveform change in the transmitted signal, and determining whether a device exists based on an occurrence time of the detected waveform change.

BRIEF DESCRIPTION OF THE DRAWINGS

The above and other aspects, features and advantages of certain embodiments of the present invention will be more apparent from the following description taken in conjunction with the accompanying drawings, in which.

DETAILED DESCRIPTION OF EMBODIMENTS OF THE PRESENT INVENTION

The following description with reference to the accompanying drawings is provided to assist in a comprehensive understanding of embodiments of the invention as defined by the claims and their equivalents. It includes various specific details to assist in that understanding but these are to be regarded as mere examples. Accordingly, those of ordinary skilled in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to their dictionary meanings, but are merely used to enable a clear and consistent understanding of the invention. Accordingly, it should be apparent to those skilled in the art that the following description of embodiments of the present invention is provided for illustration purposes only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially", it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

A description will first be given of the concept of a wireless charging system applicable to embodiments of the present disclosure with reference to FIGS. 1 to 11, followed by a detailed description of methods for detecting a load in wireless charging according to various embodiments of the present disclosure with reference to FIGS. 12 to 21.

Figure 1:
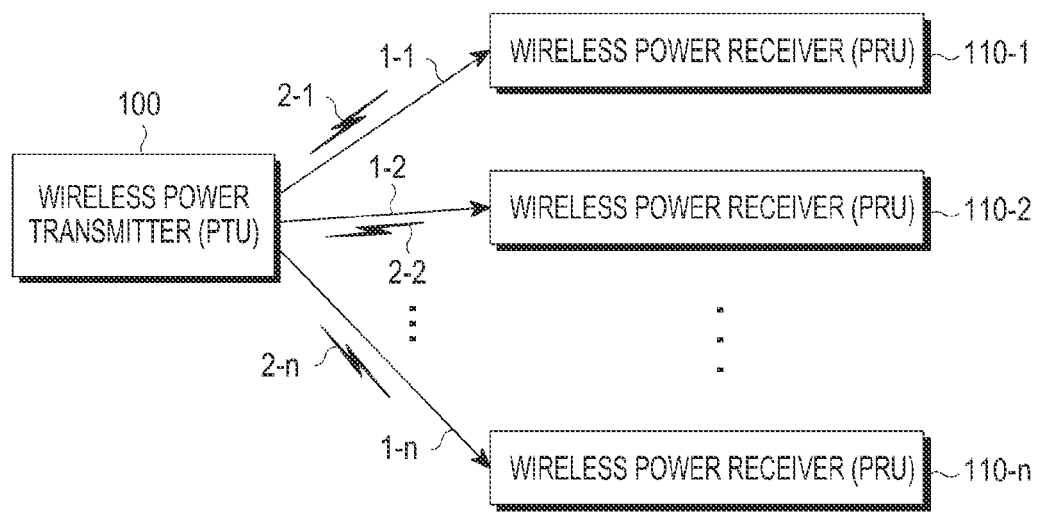
FIG. 1 is a block diagram illustrating an overall operation of a wireless charging system.

FIG. 1 is a block diagram illustrating an overall operation of a wireless charging system.

Referring to FIG. 1, the wireless charging system includes a wireless power transmitter (or Power Transmitting Unit (PTU)) 100 and one or more wireless power receivers (or Power Receiving Units (PRUs)) 110-1, 110-2, ..., and 110-n.

The wireless power transmitter 100 wirelessly transmits power 1-1, 1-2, ..., and 1-n, respectively, to the wireless power receivers 110-1, 110-2, ..., and 110-n. More specifically, the wireless power transmitter 100 may wirelessly transmit the power 1-1, 1-2, ..., and 1-n only to wireless power receivers that have been authenticated in a predetermined authentication procedure.

The wireless power transmitter 100 establishes electrical connections to the wireless power receivers 110-1, 110-2, . . . , and 110-n. For example, the wireless power transmitter 100 transmits wireless power in the form of electromagnetic waves to the wireless power receivers 110-1, 110-2, . . . , and 110-n.

The wireless power transmitter 100 conducts bi-directional communication with the wireless power receivers 110-1, 110-2, . . . , and 110-n. The wireless power transmitter 100 and the wireless power receivers 110-1, 110-2, . . . , and 110-n process or transmit/receive packets 2-1, 2-2, . . . , and 2-n configured in predetermined frames. The frames will be described below in greater detail. A wireless power receiver 110-1, 110-2, . . . , 110-n may be configured as a mobile communication terminal, a Personal Digital Assistant (PDA), a Personal Multimedia Player (PMP), a smartphone, or the like.

The wireless power transmitter 100 applies power wirelessly to the plurality of wireless power receivers 110-1, 110-2, . . . , and 110-n. For example, the wireless power transmitter 100 transmits power to the plurality of wireless power receivers 110-1, 110-2, . . . , and 110-n by resonance. If the wireless power transmitter 100 adopts the resonance scheme, the distance between the wireless power transmitter 100 and the wireless power receivers 110-1, 110-2, . . . , and 110-n may be 30 m or smaller. If the wireless power transmitter 100 adopts an electromagnetic induction scheme, the distance between the wireless power transmitter 100 and the wireless power receivers 110-1, 110-2, . . . , and 110-n may be 10 cm or smaller.

The wireless power receivers 110-1, 110-2, . . . , and 110-n receive wireless power from the wireless power transmitter 100 and charge their internal batteries. Further, the wireless power receivers 110-1, 110-2, . . . , and 110-n transmit to the wireless power transmitter 100 a signal requesting wireless power transmission, information required for wireless power reception, wireless power receiver state information, or control information for the wireless power transmitter 100. Information of the transmitted signal is described below in greater detail.

Each of the wireless power receivers 110-1, 110-2, . . . , and 110-n also transmits a message indicating its charged state to the wireless power transmitter 100.

The wireless power transmitter 100 includes a display means such as a display and displays the state of each wireless power receiver 110-1, 110-2, . . . , 110-n based on the messages received from the wireless power receivers 110-1, 110-2, . . . , and 110-n. Further, the wireless power transmitter 100 displays a time when it is expected that each of the wireless power receivers 110-1, 110-2, . . . , and 110-n will be completely charged.

The wireless power transmitter 100 transmits a control signal for disabling a wireless charging function to the wireless power receivers 110-1, 110-2, . . . , and 110-n. Upon receipt of the control signal for disabling the wireless charging function from the wireless power transmitter 100, a wireless power receiver 110-1, 110-2, . . . , 110-n disables the wireless charging function.

Figure 2:
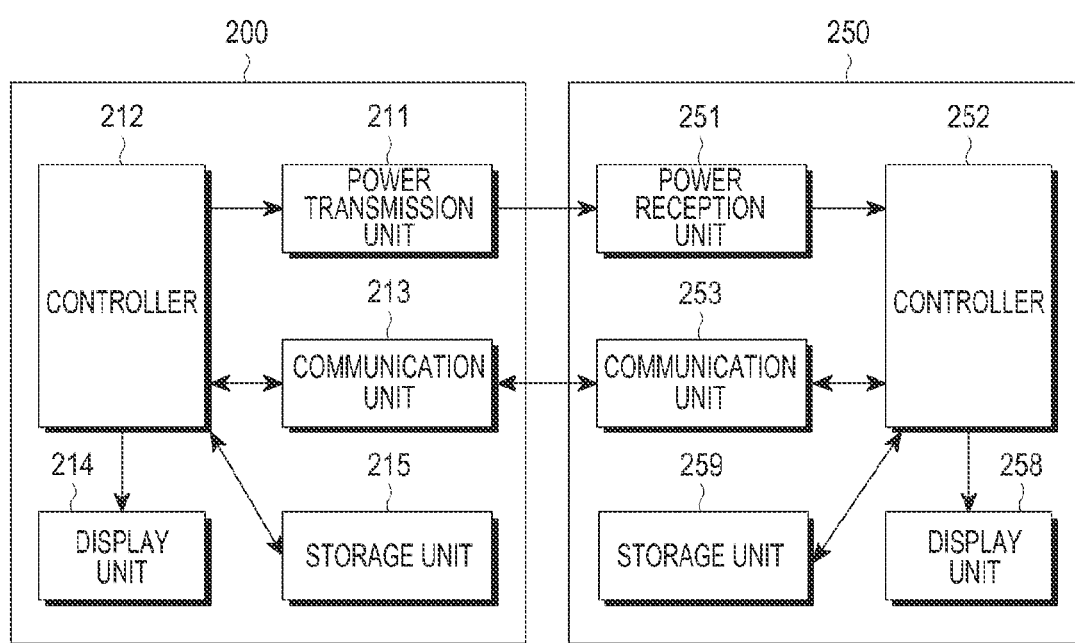
FIG. 2 is a block diagram illustrating a wireless power transmitter and a wireless power receiver, according to an embodiment of the present invention.

FIG. 2 is a block diagram illustrating a wireless power transmitter 200 and a wireless power receiver 250, according to an embodiment of the present invention.

Referring to FIG. 2, the wireless power transmitter 200 includes at least one of a power transmission unit 211, a controller 212, a communication unit 213, a display unit 214, and a storage unit 215.

The power transmission unit 211 supplies power required for the wireless power transmitter 200 and wirelessly supplies power to the wireless power receiver 250. The power transmission unit 211 supplies power in the form of Alternate Current (AC) waveforms or by converting power in Direct Current (DC) waveforms to power in AC waveforms by means of an inverter. The power transmission unit 211 may be implemented as a built-in battery. Alternatively, the power transmission units 211 may be implemented as a power reception interface so as to receive power from externally and supply the power to other components. It will be understood by those skilled in the art that as far as it can supply power in AC waveforms, any means may be used as the power transmission unit 211.

The controller 212 provides overall control to the wireless power transmitter 200. The controller 212 controls the overall operation of the wireless power transmitter 200 using an algorithm, a program, or an application required for a control operation, read from the storage unit 215. The controller 212 may be configured as a Central Processing Unit (CPU), a microprocessor, or a mini computer.

The communication unit 213 communicates with the wireless power receiver 250 in a predetermined communication scheme. The communication unit 213 receives power information from the wireless power receiver 250. The power information includes information about at least one of the capacity, residual battery amount, use amount, battery capacity, and battery proportion of the wireless power receiver 250.

Further, the communication unit 213 transmits a charging function control signal for controlling the charging function of the wireless power receiver 250. The charging function control signal is a control signal that enables or disables the charging function by controlling a power reception unit 251 of the wireless power receiver 250. Alternatively, the power information includes information about insertion of a wired charging terminal, transition from a Stand Alone (SA) mode to a Non-Stand Alone (NSA) mode, error state release, and the like, as described below in detail.

In addition, the charging function control signal includes information related to power control or a power adjust command to cope with an occurrence of an abnormality according to an embodiment of the present invention.

The communication unit 213 may receive a signal from another wireless power transmitter as well as the wireless power receiver 250.

The controller 212 displays a state of the wireless power receiver 250 on the display unit 214 based on a message received from the wireless power receiver 250 via the communication unit 213. Further, the controller 212 displays a time by which the wireless power receiver 250 is expected to be completely charged, on the display unit 214.

As illustrated in FIG. 2, the wireless power receiver 250 includes at least one of a power reception unit 251, a controller 252, a communication unit 253, a display unit 258, and a storage unit 259.

The power reception unit 251 receives power wirelessly from the wireless power transmitter 200. The power reception unit 251 receives power in the form of AC waveforms from the wireless power transmitter 200.

The controller 252 provides overall control to the wireless power receiver 250. The controller 252 controls the overall operation of the wireless power receiver 250 using an algorithm, a program, or an application required for a control operation, read from the storage unit 259. The controller 252 may be configured as a CPU, a microprocessor, or a mini computer.

The communication unit 253 communicates with the wireless power transmitter 200 in a predetermined communication scheme. The communication unit 253 transmits power information to the wireless power transmitter 200. The power information includes information about at least one of the capacity, residual battery amount, use amount, battery capacity, and battery proportion of the wireless power receiver 250.

Further, the communication unit 253 transmits a charging function control signal for controlling the charging function of the wireless power receiver 250. The charging function control signal is a control signal that enables or disables the charging function by controlling the power reception unit 251 of the wireless power receiver 250. Alternatively, the power information includes information about insertion of a wired charging terminal, transition from the SA mode to the NSA mode, error state release, and the like, as described below in detail.

Further, the charging function control signal includes information related to power control or a power adjust command to cope with an occurrence of an abnormality according to an embodiment of the present invention.

The controller 252 displays a state of the wireless power receiver 250 on the display unit 258. Further, the controller 252 displays a time by which the wireless power receiver 250 is expected to be completely charged, on the display unit 258.

Figure 3:
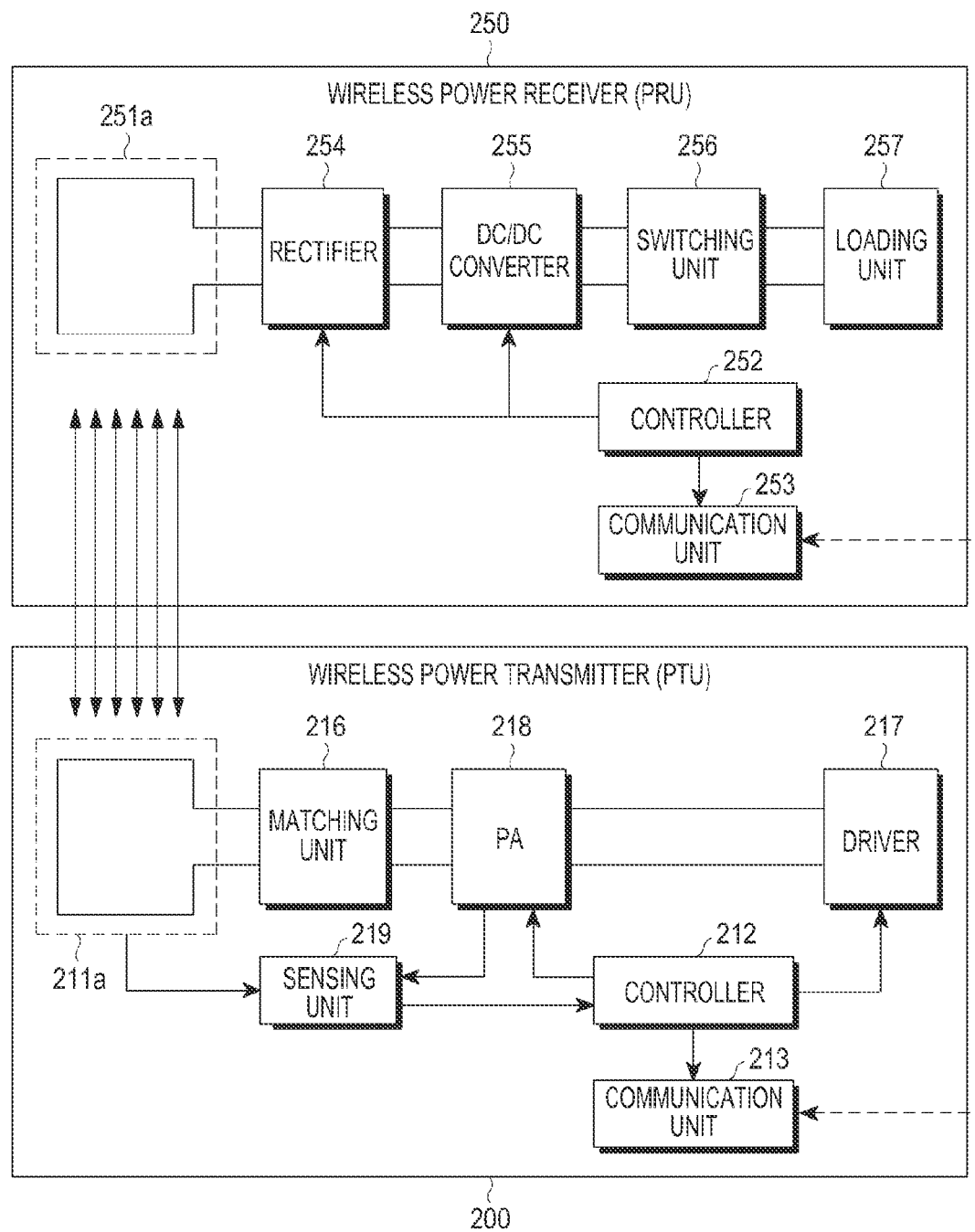
FIG. 3 is a block diagram illustrating a wireless power transmitter and a wireless power receiver, according to an embodiment of the present invention.

FIG. 3 is a block diagram illustrating the wireless power transmitter 200 and the wireless power receiver 250, according to an embodiment of the present invention.

Referring to FIG. 3, the wireless power transmitter 200 includes at least one of a Transmission (Tx) resonator 211a, the controller 212 (for example, a Micro Controller Unit (MCU)), the communication unit 213 (for example, an out-of-band signaling unit), a matching unit 216, a driver (e.g. a power supply) 217, a Power Amplifier (PA) 218, and a sensing unit 219. The wireless power receiver 250 includes at least one of a Reception (Rx) resonator 251a, the controller 252, the communication unit 253, a rectifier 254, a DC/DC converter 255, a switching unit 256, and a loading unit 257.

The driver 217 outputs DC power having a predetermined voltage value. The voltage value of the DC power output from the driver 217 is controlled by the controller 212.

A DC current output from the driver 217 is applied to the PA 218. The PA 218 amplifies the DC current with a predetermined gain. Further, the PA 218 converts DC power to AC power based on a signal received from the controller 212. Therefore, the PA 218 outputs AC power.

The matching unit 216 performs impedance matching. For example, the matching unit 216 controls an impedance viewed from the matching unit 216 so that its output power has high efficiency or high power. The sensing unit 219 senses a load variation of the wireless power receiver 250 via the Tx resonator 211a or the PA 218 and provides the sensing result to the controller 212.

The matching unit 216 adjusts impedance under control of the controller 212. The matching unit 216 includes at least one of a coil and a capacitor. The controller 212 controls a connection state to at least one of the coil and the capacitor and thus may perform impedance matching accordingly.

The Tx resonator 211a transmits input AC power to the Rx resonator 251a. The Tx resonator 211a and the Rx resonator 251a are configured as resonant circuits having the same resonant frequency. For example, the resonant frequency may be determined to be 6.78 MHz.

The communication unit 213 communicates with the communication unit 253 of the wireless power receiver 250, for example, bi-directionally at 2.4 GHz (by Wireless Fidelity (WiFi), ZigBee, or Bluetooth (BT)/Bluetooth Low Energy (BLE)).

The Rx resonator 251a receives power for charging.

The rectifier 254 rectifies wireless power received from the Rx resonator 251a to DC power. For example, the rectifier 254 may be configured as a bridge diode. The DC/DC converter 255 converts the rectified power with a predetermined gain. For example, the DC/DC converter 255 converts the rectified power so that the voltage of its output may be 5V. A minimum voltage value and a maximum voltage value that may be applied to the input of the DC/DC converter 255 may be preset.

The switching unit 256 connects the DC/DC converter 255 to the loading unit 257. The switching unit 256 is kept in an ON or OFF state under the control of the controller 252. The switching unit 256 may be omitted. If the switching unit 256 is in the ON state, the loading unit 257 stores the converted power received from the DC/DC converter 255.

Figure 4:
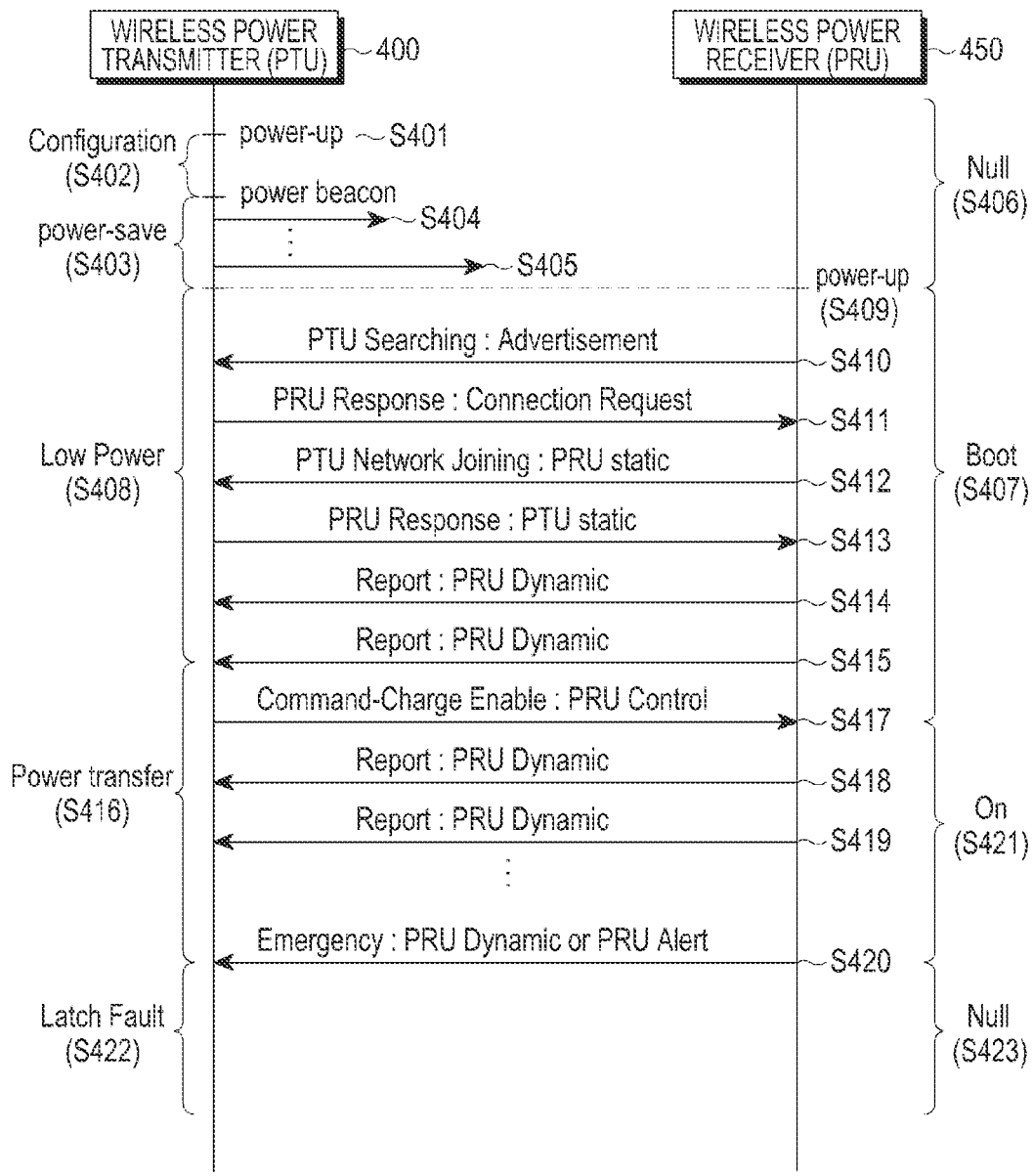
FIG. 4 is a diagram illustrating a signal flow for operations of a wireless power transmitter and a wireless power receiver, according to an embodiment of the present invention.

FIG. 4 is a diagram illustrating a signal flow for operations of a wireless power transmitter 400 and a wireless power receiver 450, according to an embodiment of the present invention.

Referring to FIG. 4, the wireless power transmitter 400 is powered ON, in step S401. Upon power-on, the wireless power transmitter 400 configures an environment, in step S402.

The wireless power transmitter 400 enters a power save mode, in step S403. In the power save mode, the wireless power transmitter 400 applies different types of power beacons for detection, with their respective periods, which will be described below in greater detail with reference to FIG. 6. For example, the wireless power transmitter 400 transmits power beacons 404 and 405 for detection (for example, short beacons or long beacons) and the power beacons 404 and 405 may have different power values. One or both of the power beacons 404 and 405 for detection may have sufficient power to drive the communication unit of the wireless power receiver 450. For example, the wireless power receiver 450 communicates with the wireless power transmitter 400 by driving its communication unit by means of one or both of the power beacons 404 and 405 for detection. This state may be referred to as a null state.

The wireless power transmitter 400 detects a load variation caused by disposition of the wireless power receiver 450. The wireless power transmitter 400 enters a low power mode, in step S408. The low power mode is described below in greater detail with reference to FIG. 6. The wireless power receiver 450 drives the communication unit with power received from the wireless power transmitter 400, in step S409.

The wireless power receiver 450 transmits a PTU searching signal to the wireless power transmitter 400, in step S410. The wireless power receiver 450 may transmit the PTU searching signal by a BLE-based Advertisement (AD) signal. The wireless power receiver 450 may transmit the PTU searching signal periodically until it receives a response signal from the wireless power transmitter 400 or a predetermined time period lapses.

Upon receipt of the PTU searching signal from the wireless power receiver 450, the wireless power transmitter 400 transmits a PRU response signal, in step S411. The PRU response signal establishes a connection between the wireless power transmitter 400 and the wireless power receiver 450.

The wireless power receiver 450 transmits a PRU static signal, in step S412. The PRU static signal indicates a state of the wireless power receiver 450 and requests joining in a wireless power network managed by the wireless power transmitter 400.

The wireless power transmitter 400 transmits a PTU static signal, in step S413. The PTU static signal indicates capabilities of the wireless power transmitter 400.

Once the wireless power transmitter 400 and the wireless power receiver 450 transmit and receive the PRU static signal and the PTU static signal, the wireless power receiver 450 transmits a PRU dynamic signal periodically, in steps S414 and S415. The PRU dynamic signal includes at least one parameter measured by the wireless power receiver 450. For example, the PRU dynamic signal may include information about a voltage at the output of a rectifier of the wireless power receiver 450. The state of the wireless power receiver 450 may be referred to as a boot state, in step S407.

The wireless power transmitter 400 enters a power transfer mode, in step S416. The wireless power transmitter 400 transmits a PRU control signal commanding charging to the wireless power receiver 450, in step S417. In the power transfer mode, the wireless power transmitter 400 transmits charging power.

The PRU control signal transmitted by the wireless power transmitter 400 includes information that enables/disables charging of the wireless power receiver 450 and permission information. The PRU control signal may be transmitted each time a charged state is changed. For example, the PRU control signal may be transmitted every 250 ms or upon occurrence of a parameter change. The PRU control signal may be configured to be transmitted within a predetermined threshold time, for example, within 1 second, even though no parameter is changed.

The wireless power receiver 450 changes a setting according to the PRU control signal and transmits a PRU dynamic signal to report a state of the wireless power receiver 450, in step S418 and S419. The PRU dynamic signal transmitted by the wireless power receiver 450 includes information about at least one of a voltage, a current, a wireless power receiver state, and a temperature. The state of the wireless power receiver 450 may be referred to as an ON state.

The PRU dynamic signal may have the following data structure illustrated in Table 1 below.

TABLE 1

| Field | Octets | Description | Use | Units |
|---|---|---|---|---|
| Optional fields | 1 | Defines which optional fields are populated | Mandatory | |
| $V_{RECT}$ | 2 | Voltage at diode output | Mandatory | mV |
| $I_{RECT}$ | 2 | Current at diode output | Mandatory | mA |
| $V_{OUT}$ | 2 | Voltage at charge/battery port | Optional | mV |
| $I_{OUT}$ | 2 | Current at charge/battery port | Optional | mA |
| Temperature | 1 | Temperature of PRU | Optional | Deg C. from −40 C. |
| $V_{RECT\_MIN\_DYN}$ | 2 | $V_{RECT\_LOW\_LIMIT}$ (dynamic value) | Optional | mV |
| $V_{RECT\_SET\_DYN}$ | 2 | Desired $V_{RECT}$ (dynamic value) | Optional | mV |
| $V_{RECT\_HIGH\_DYN}$ | 2 | $V_{RECT\_HIGH\_LIMIT}$ (dynamic value) | Optional | mV |
| PRU alert | 1 | Warnings | Mandatory | Bit field |
| RFU | 3 | Undefined | | |

Referring to Table 1, the PRU dynamic signal includes one or more fields. The fields provide optional field information, information about a voltage at the output of the rectifier of the wireless power receiver, information about a current at the output of the rectifier of the wireless power receiver, information about a voltage at the output of the DC/DC converter of the wireless power receiver, information about a current at the output of the DC/DC converter of the wireless power receiver, temperature information, information about a minimum voltage value VRECT_MIN_DYN at the output of the rectifier of the wireless power receiver, information about an optimum voltage value VRECT_SET_DYN at the output of the rectifier of the wireless power receiver, information about a maximum voltage value VRECT_HIGH_DYN at the output of the rectifier of the wireless power receiver, and warning information. The PRU dynamic signal may include at least one of the above fields.

For example, at least one voltage set value that has been determined according to a charging situation (for example, the information about a minimum voltage value VRECT_MIN_DYN at the output of the rectifier of the wireless power receiver, the information about an optimum voltage value VRECT_SET_DYN at the output of the rectifier of the wireless power receiver, and the information about a maximum voltage value VRECT_HIGH_DYN at the output of the rectifier of the wireless power receiver) may be transmitted in the at least one field of the PRU dynamic signal. Upon receipt of the PRU dynamic signal, the wireless power transmitter may adjust a wireless charging voltage to be transmitted to each wireless power receiver based on the voltage value set in the PRU dynamic signal.

Among the fields, PRU Alert may be configured in the data structure illustrated in Table 2.

TABLE 2

| 7 | 6 | 5 | 4 | 3 | 2 | 1 | 0 |
|---|---|---|---|---|---|---|---|
| Over-voltage | Over-current | Over-temp | Charge complete | TA detect | Transition | restart request | RFU |

Referring to Table 2, PRU Alert may include a bit for a restart request, a bit for a transition, and a bit for Travel Adapter (TA) detect. The TA detect bit indicates that a wireless power receiver has been connected to a wired charging terminal in the wireless power transmitter that provides wireless charging. The Transition bit indicates to the wireless power transmitter that a communication Integrated Circuit (IC) of the wireless power receiver is reset before the wireless power receiver transitions from the SA mode to the NSA mode. Finally, the restart request bit indicates that the wireless power transmitter is ready to resume charging of the wireless power receiver when the wireless power transmitter that has discontinued charging by reducing transmission power due to overcurrent or overtemperature returns to a normal state.

PRU Alert may also be configured in the data structure illustrated in Table 3 below.

TABLE 3

| 7 | 6 | 5 | 4 | 3 | 2 | 1 | 0 |
|---|---|---|---|---|---|---|---|
| PRU over-voltage | PRU over-current | PRU over-temperature | PRU Self Protection | Charge Complete | Wired Charger Detect | Mode Transition Bit 1 | Mode Transition Bit 0 |

Referring to Table 3, PRU Alert includes the fields of overvoltage, overtemperature, PRU Self Protection, Charge Complete, Wired Charger Detect, and Mode Transition. If the overvoltage field is set to "1", this implies that the voltage Vrect of the wireless power receiver has exceeded an overvoltage limit. The overcurrent and overtemperature fields may be set in the same manner as the overvoltage field. PRU Self Protection refers to the wireless power receiver protecting itself by directly reducing power affecting a load. In this case, the wireless power transmitter does not need to change a charged state.

According to an embodiment of the present invention, bits for Mode Transition are set to a value indicating the duration of a mode transition to the wireless power transmitter. The Mode Transition bits may be configured as illustrated in Table 4.

TABLE 4

| Value(Bit) | Mode Transition Bit Description |
| --- | --- |
| 00 | No Mode Transition |
| 01 | 2 s Mode Transition time limit |
| 10 | 3 s Mode Transition time limit |
| 11 | 6 s Mode Transition time limit |

Referring to Table 4, if the Mode Transition bits are set to "00", this indicates no mode transition. If the Mode Transition bits are set to "01", this indicates that a time limit for completion of a mode transition is 2 seconds. If the Mode Transition bits are set to "10", this indicates that the time limit for completion of a mode transition is 3 seconds. If the Mode Transition bits are set to "11", this indicates that the time limit for completion of a mode transition is 6 seconds.

For example, if a mode transition takes 3 seconds or less, the Mode Transition bits may be set to "10". Before starting a mode transition, the wireless power receiver ensures that no impedance shift will occur during the mode transition by changing an input impedance setting to match a 1.1 W power draw. Accordingly, the wireless power transmitter adjusts a power ITX_COIL for the wireless power receiver according to this setting and thus maintains the power ITX_COIL for the wireless power receiver during the mode transition.

Therefore, once a mode transition duration is set by the Mode Transition bits, the wireless power transmitter maintains the power ITX_COIL for the wireless power receiver during the mode transition duration, for example, for 3 seconds. In other words, even though the wireless power transmitter does not receive a response from the wireless power receiver for 3 seconds, the wireless power transmitter maintains a connection to the wireless power receiver. However, after the mode transition duration lapses, the wireless power transmitter ends the power transmission, considering that the wireless power receiver is a rogue object.

The wireless power receiver 450 senses generation of an error. The wireless power receiver 450 transmits a warning signal to the wireless power transmitter 400, in step S420. The warning signal may be transmitted by a PRU dynamic signal or an alert signal. For example, the wireless power receiver 450 may transmit the PRU Alert field illustrated in Table 1 to indicate an error state to the wireless power transmitter 400. Alternatively, the wireless power receiver 450 may transmit a stand-alone warning signal indicating an error state to the wireless power transmitter 400. Upon receipt of the warning signal, the wireless power transmitter 400 enters a latch fault mode, in step S422. The wireless power receiver 450 enters a null state, in step S423.

Figure 5:
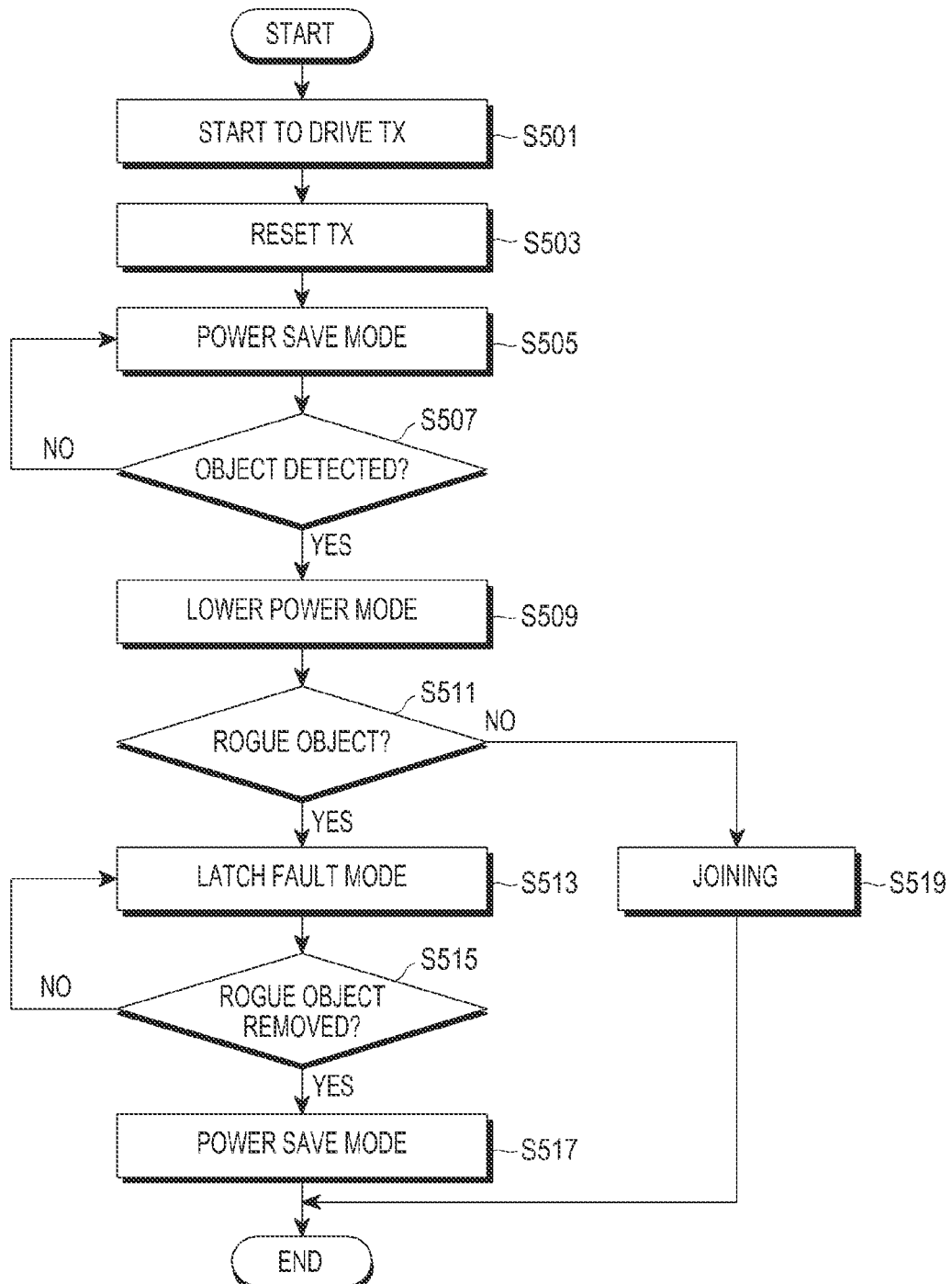
FIG. 5 is a flowchart illustrating a signal flow for operations of a wireless power transmitter and a wireless power receiver, according to another embodiment of the present invention.

FIG. 5 is a flowchart illustrating a signal flow for operations of a wireless power transmitter and a wireless power receiver, according to an embodiment of the present invention. The control method of FIG. 5 is described below in detail with reference to FIG. 6.

Figure 6:
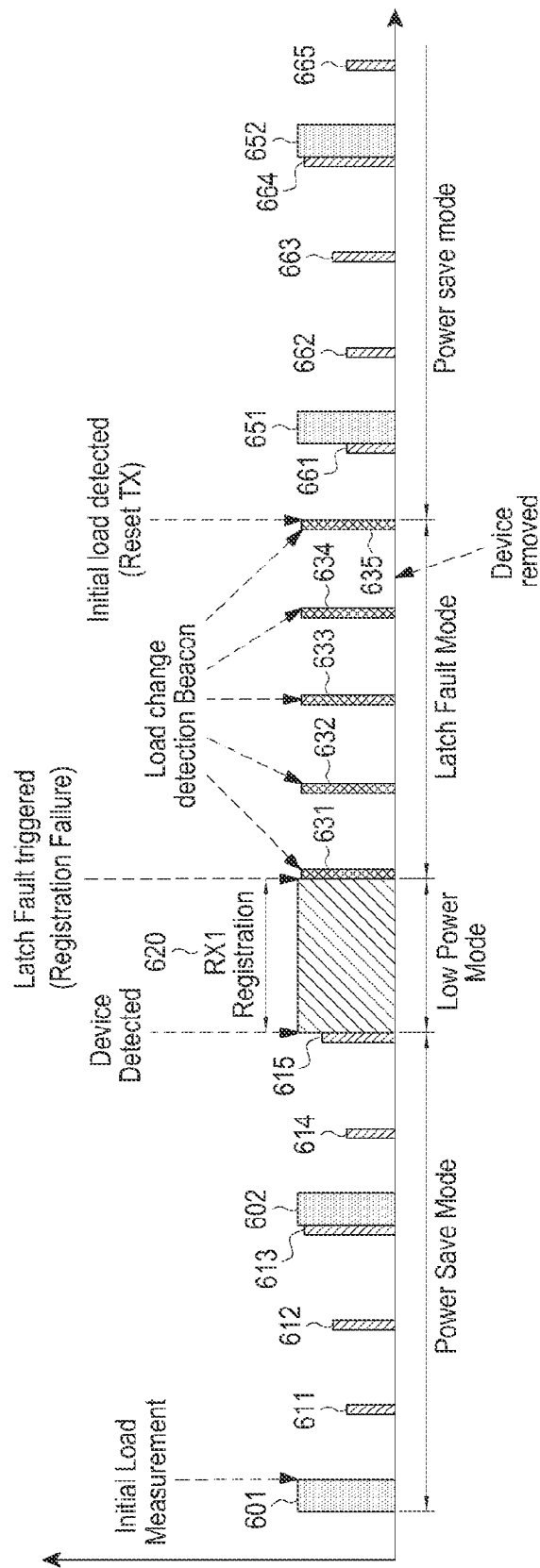
FIG. 6 is a graph illustrating amounts of power applied by a wireless power transmitter with respect to a time axis.

FIG. 6 is a graph illustrating amounts of power applied by the wireless power transmitter with respect to a time axis.

Referring to FIG. 5, the wireless power transmitter starts to operate, in step S501. Further, the wireless power transmitter rests an initial setting, in step S503 and enters the power save mode, in step S505. The wireless power transmitter applies different types of power having different power amounts to a power transmitter in the power save mode. For example, the wireless power transmitter may apply second detection power 601 and 602 and third detection power 611 to 615 to the power transmitter in FIG. 6. The wireless power transmitter may apply the second detection power 601 and 602 periodically with a second period. When the wireless power transmitter supplies the second detection power 601 and 602, the second detection power 601 and 602 may last for a second time duration. The wireless power transmitter may apply the third detection power 611 to 615 periodically with a third period. When the wireless power transmitter supplies the third detection power 611 to 615, the third detection power 611 to 615 may last for a third time duration. The third detection power 611 to 615 may have the same power value, or different power values as illustrated in FIG. 6.

After outputting the third detection power 611, the wireless power transmitter outputs the third detection power 612 having the same power amount. If the wireless power transmitter outputs third detection power having the same amount as described above, the third detection power may have a power amount sufficient to detect the smallest wireless power receiver, for example, a wireless power receiver of Category 1.

In contrast, after outputting the third detection power 611, the wireless power transmitter may output the third detection power 612 having a different power amount. If the wireless power transmitter outputs different amounts of third detection power as described above, the respective power amounts of the third detection power may be sufficient to detect wireless power receivers of Category 1 to Category 5. For example, the third detection power 611 may have a power amount sufficient to detect a wireless power receiver of Category 5, the third detection power 612 may have a power amount sufficient to detect a wireless power receiver of Category 3, and the third detection power 613 may have a power amount sufficient to detect a wireless power receiver of Category 1.

The second detection power 601 and 602 may drive the wireless power receiver. More specifically, the second detection power 601 and 602 may have a power amount sufficient to drive the controller and/or the communication unit of the wireless power receiver.

The wireless power transmitter may apply the second detection power 601 and 602 and the third detection power 611 to 615 respectively with the second and third periods to the wireless power receiver. If the wireless power receiver is placed on the wireless power transmitter, impedance viewed from the wireless power transmitter may be changed. The wireless power transmitter may detect an impedance shift during application of the second detection power 601 and 602 and the third detection power 611 to 615. For example, the wireless power transmitter may detect an impedance shift during application of the third detection power 615. Therefore, the wireless power transmitter may detect an object, in step S507. If no object is detected, in step S507, e.g. NO, the wireless power transmitter is kept in the power save mode in which it applies different types of power periodically, in step S505.

If the wireless power transmitter detects an object due to an impedance shift, in step S507, e.g. YES, the wireless power transmitter enters the low power mode. In the low power mode, the wireless power transmitter applies a driving power having a power amount sufficient to drive the controller and the communication unit of the wireless power receiver. For example, the wireless power transmitter applies driving power 620 to the power transmitter in FIG. 6. The wireless power receiver receives the driving power 620 and drives the controller and/or the communication unit with the driving power 620. The wireless power receiver communicates with the wireless power transmitter with the driving power 620 in a predetermined communication scheme. For example, the wireless power receiver may transmit and receive data required for authentication and may join a wireless power network managed by the wireless power transmitter based on the data. However, if a rogue object is placed instead of a wireless power receiver, data transmission and reception are not performed. Therefore, the wireless power transmitter determines whether the object is a rogue object, in step S511. For example, if the wireless power transmitter fails to receive a response from the object for a predetermined time, the wireless power transmitter determines the object to be a rogue object.

If the wireless power transmitter determines the object to be a rogue object, in step S511, e.g. YES, the wireless power transmitter enters the latch fault mode, in step S513. In contrast, if the wireless power transmitter determines that the object is not a rogue object, in step S511, e.g., NO, the wireless power transmitter may proceeds to a joining operation, in step S519. For example, the wireless power transmitter may apply first power 631 to 634 periodically with a first period in FIG. 6. The wireless power transmitter may detect an impedance shift during application of the first power. For example, if the rogue object is removed, in step S515, e.g. YES, the wireless power transmitter detects an impedance shift and thus determines that the rogue object has been removed. In contrast, if the rogue object is not removed, in step S515, e.g. NO, the wireless power transmitter does not detect an impedance shift and thus determines that the rogue object has not been removed. If the rogue object has not been removed, the wireless power transmitter notifies a user that the wireless power transmitter is currently in an error state by performing at least one of illuminating a lamp or outputting a warning sound. Accordingly, the wireless power transmitter includes an output unit for illuminating a lamp and/or outputting a warning sound.

If determining that the rogue object has not been removed, in step S515, e.g. NO, the wireless power transmitter maintains the latch fault mode, in step S513. In contrast, if the rogue object has been removed, in step S515, e.g. YES, the wireless power transmitter reenters the power save mode, in step S517. For example, the wireless power transmitter may apply second power 651 and 652 and third power 661 to 665 in FIG. 6.

As described above, if a rogue object is placed on the wireless power transmitter, instead of a wireless power receiver, the wireless power transmitter enters the latch fault mode. Further, the wireless power transmitter determines whether the rogue object has been removed based on an impedance shift that occurs according to power applied in the latch fault mode. That is, a condition of entry to the latch fault mode is the presence of a rogue object in the embodiment illustrated in FIGS. 5 and 6. Besides the presence of a rogue object, the wireless power transmitter may have many other conditions for entry to the latch fault mode. For example, the wireless power transmitter may be cross-connected to a mounted wireless power receiver. In this case, the wireless power transmitter also enters the latch fault mode.

When the wireless power transmitter is cross-connected to a wireless power receiver, the wireless power transmitter must return to an initial state and the wireless power receiver should be removed. The wireless power transmitter may set cross connection of a wireless power receiver placed on another wireless power transmitter, that is, joining of a wireless power receiver placed on another wireless power transmitter in a wireless power network managed by the wireless power transmitter, as a condition for entry to the latch fault mode. An operation of a wireless power transmitter upon occurrence of an error such as cross connection is described below with reference to FIG. 7.

Figure 7:
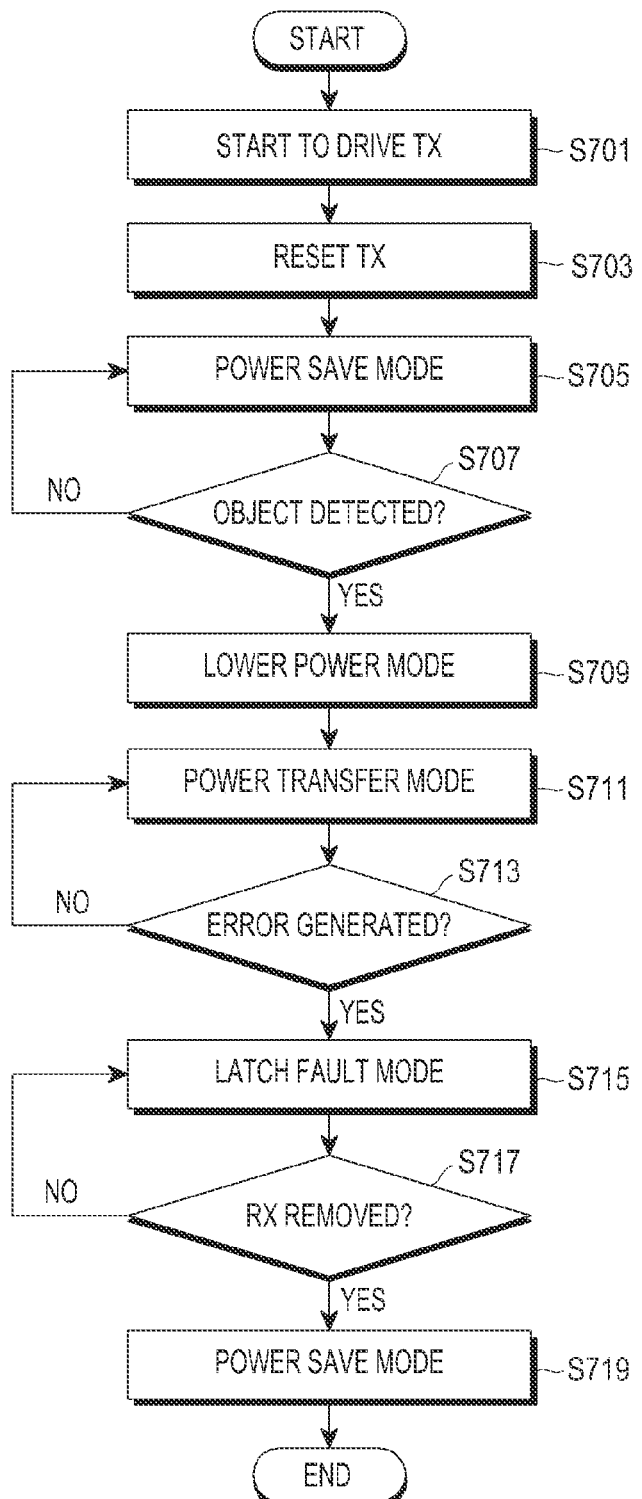
FIG. 7 is a flowchart illustrating a method for controlling a wireless power transmitter, according to an embodiment of the present invention.

FIG. 7 is a flowchart illustrating a method for controlling a wireless power transmitter, according to an embodiment of the present invention. The control method of FIG. 7 is described below in detail with reference to FIG. 8.

Figure 8:
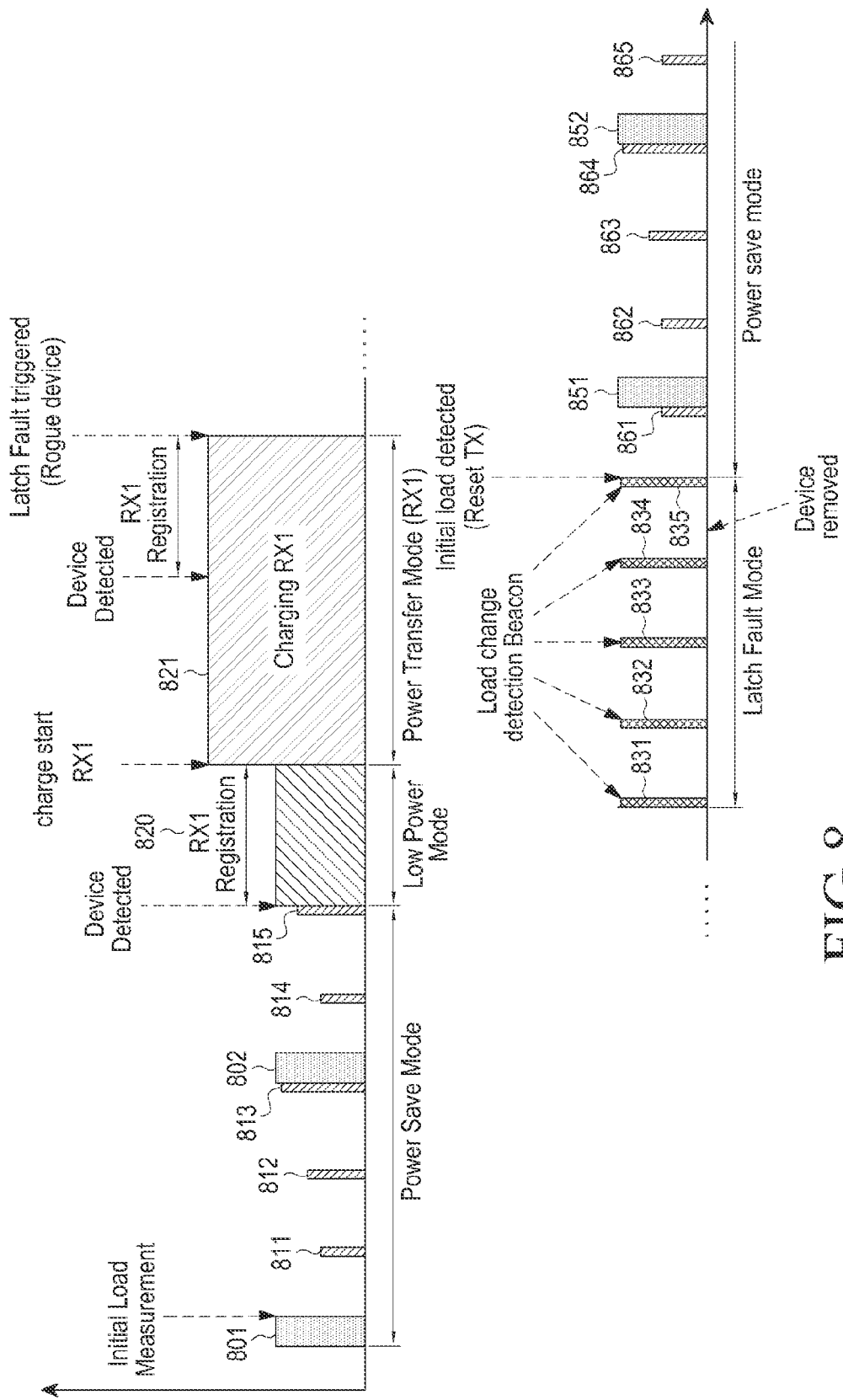
FIG. 8 is a graph illustrating amounts of power applied by a wireless power transmitter with respect to a time axis according to FIG. 7.

FIG. 8 is a graph illustrating amounts of power supplied by the wireless power transmitter with respect to a time axis according to the embodiment of the present invention illustrated in FIG. 7.

Referring to FIG. 7, the wireless power transmitter starts to operate, in step S701. Further, the wireless power transmitter may reset an initial setting, in step S703, and may enter the power save mode, in step S705. The wireless power transmitter may apply different types of power having different power amounts to the power transmitter in the power save mode. For example, the wireless power transmitter may apply second detection power 801 and 802 and third detection power 811 to 815 to the power transmitter in FIG. 8. The wireless power transmitter may apply the second detection power 801 and 802 periodically with a second period. When the wireless power transmitter applies the second detection power 801 and 802, the second detection power 801 and 802 lasts for a second time duration. The wireless power transmitter may apply the third detection power 811 to 815 periodically with a third period. When the wireless power transmitter applies the third detection power 811 to 815, the third detection power 811 to 815 lasts for a third time duration. The third detection power 811 to 815 may have the same power value, or different power values as illustrated in FIG. 8.

The second detection power 801 and 802 may drive the wireless power receiver. More specifically, the second detection power 801 and 802 may have a power amount sufficient to drive the controller and/or the communication unit of the wireless power receiver.

The wireless power transmitter may apply the second detection power 801 and 802 and the third detection power 811 to 815 respectively with the second and third periods to the wireless power receiver. If the wireless power receiver is placed on the wireless power transmitter, impedance viewed from the wireless power transmitter may be changed. The wireless power transmitter may detect an impedance shift during application of the second detection power 801 and 802 and the third detection power 811 to 815. For example, the wireless power transmitter may detect an impedance shift during application of the third detection power 815. Therefore, the wireless power transmitter detects an object, in step S707. If no object is detected, in step S707, e.g. NO, the wireless power transmitter is kept in the power save mode in which it applies different types of power periodically, in step S705.

If the wireless power transmitter detects an object due to an impedance shift, in step S707, e.g. YES, the wireless power transmitter enters the low power mode, in step S709. In the low power mode, the wireless power transmitter applies a driving power having a power amount sufficient to drive the controller and/or the communication unit of the wireless power receiver. For example, the wireless power transmitter applies driving power 820 to the power transmitter in FIG. 8. The wireless power receiver receives the driving power 820 and drives the controller and/or the communication unit with the driving power 820. The wireless power receiver communicates with the wireless power transmitter with the driving power 820 in a predetermined communication scheme. For example, the wireless power receiver transmits and receives data required for authentication and joins a wireless power network managed by the wireless power transmitter based on the data.

Subsequently, the wireless power transmitter enters the power transfer mode in which it transmits charging power, in step S711. For example, the wireless power transmitter applies charging power 821 and the charging power 821 is transmitted to the wireless power receiver, as illustrated in FIG. 8.

In the power transfer mode, the wireless power transmitter determines whether an error has occurred. The error may be the presence of a rogue object, cross connection, overvoltage, overcurrent, or overtemperature. The wireless power transmitter includes a sensing unit for measuring overvoltage, overcurrent, or overtemperature. For example, the wireless power transmitter measures a voltage or current at a reference point and determines that a measured voltage or current exceeding a threshold satisfies an overvoltage or overcurrent condition. Alternatively, the wireless power transmitter includes a temperature sensor, and the temperature sensor measures a temperature at a reference point of the wireless power transmitter. If the temperature at the reference point exceeds a threshold, the wireless power transmitter determines that an overtemperature condition is satisfied.

If the wireless power transmitter determines an overvoltage, overcurrent, or overtemperature state according to a measured voltage, current, or temperature value, the wireless power transmitter prevents overvoltage, overcurrent, or overtemperature by decreasing wireless charging power by a predetermined value. If the voltage value of the decreased wireless charging power is below a set minimum value (for example, the minimum voltage value VRECT_MIN_DYN at the output of the rectifier of the wireless power receiver), wireless charging is discontinued and thus a voltage set value is re-adjusted according to an embodiment of the present invention.

While continued presence of a rogue object on the wireless power transmitter is shown as an error in the embodiment of the present invention illustrated in FIG. 8, the error is not limited to the continued presence of a rogue object. Thus, it will be readily understood to those skilled in the art that the wireless power transmitter may operate in a similar manner regarding the presence of a rogue object, cross connection, overvoltage, overcurrent, and overtemperature.

If no error occurs, in step S713, e.g. NO, the wireless power transmitter maintains the power transfer mode, in step S711. In contrast, if an error occurs, in step S713, e.g. YES, the wireless power transmitter enters the latch fault mode, in step S715. For example, the wireless power transmitter applies first power 831 to 835 as illustrated in FIG. 8. Further, the wireless power transmitter outputs an error notification including at least one of lamp illumination or a warning sound during the latch fault mode. If determining that the rogue object or the wireless power receiver has not been removed, in step S717, e.g. NO, the wireless power transmitter maintains the latch fault mode, in step S715. In contrast, if determining that the rogue object or the wireless power receiver has been removed, in step S717, e.g. YES, the wireless power transmitter reenters the power save mode, in step S719. For example, the wireless power transmitter applies second power 851 and 852 and third power 861 to 865 in FIG. 8.

An operation of a wireless power transmitter upon occurrence of an error during transmission of charging power has been described above. Below, a description is provided of an operation of the wireless power transmitter, when a plurality of wireless power receivers placed on the wireless power transmitter receive charging power from the wireless power transmitter.

Figure 9:
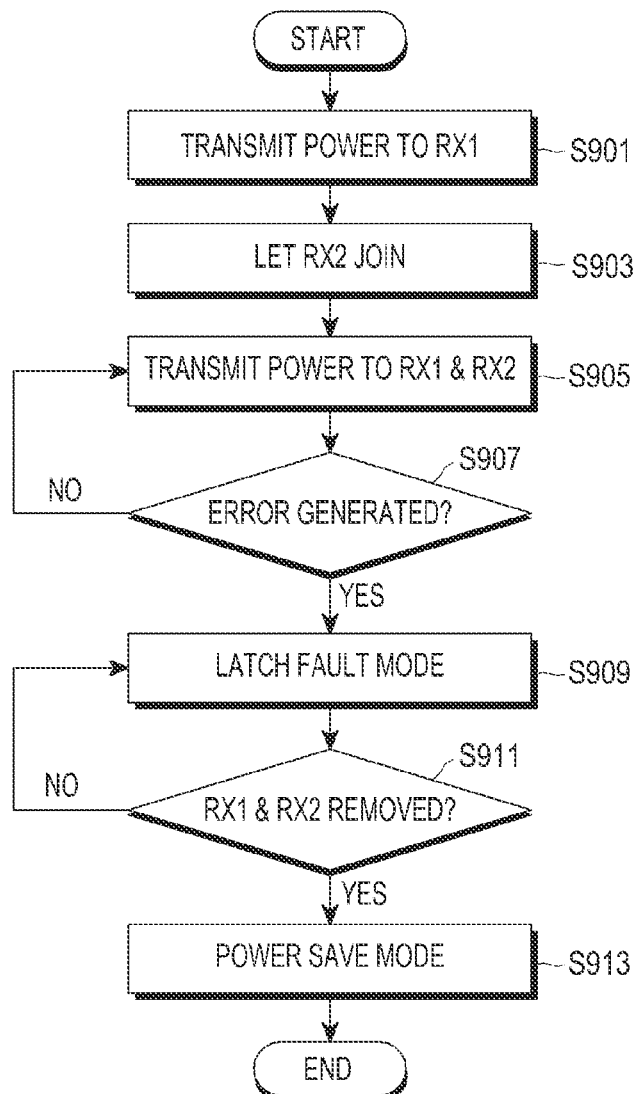
FIG. 9 is a flowchart illustrating a method for controlling a wireless power transmitter, according to an embodiment of the present invention.

FIG. 9 is a flowchart illustrating a method for controlling a wireless power transmitter, according to an embodiment of the present invention. The control method of FIG. 9 is described below in detail with reference to FIG. 9.

Figure 10:
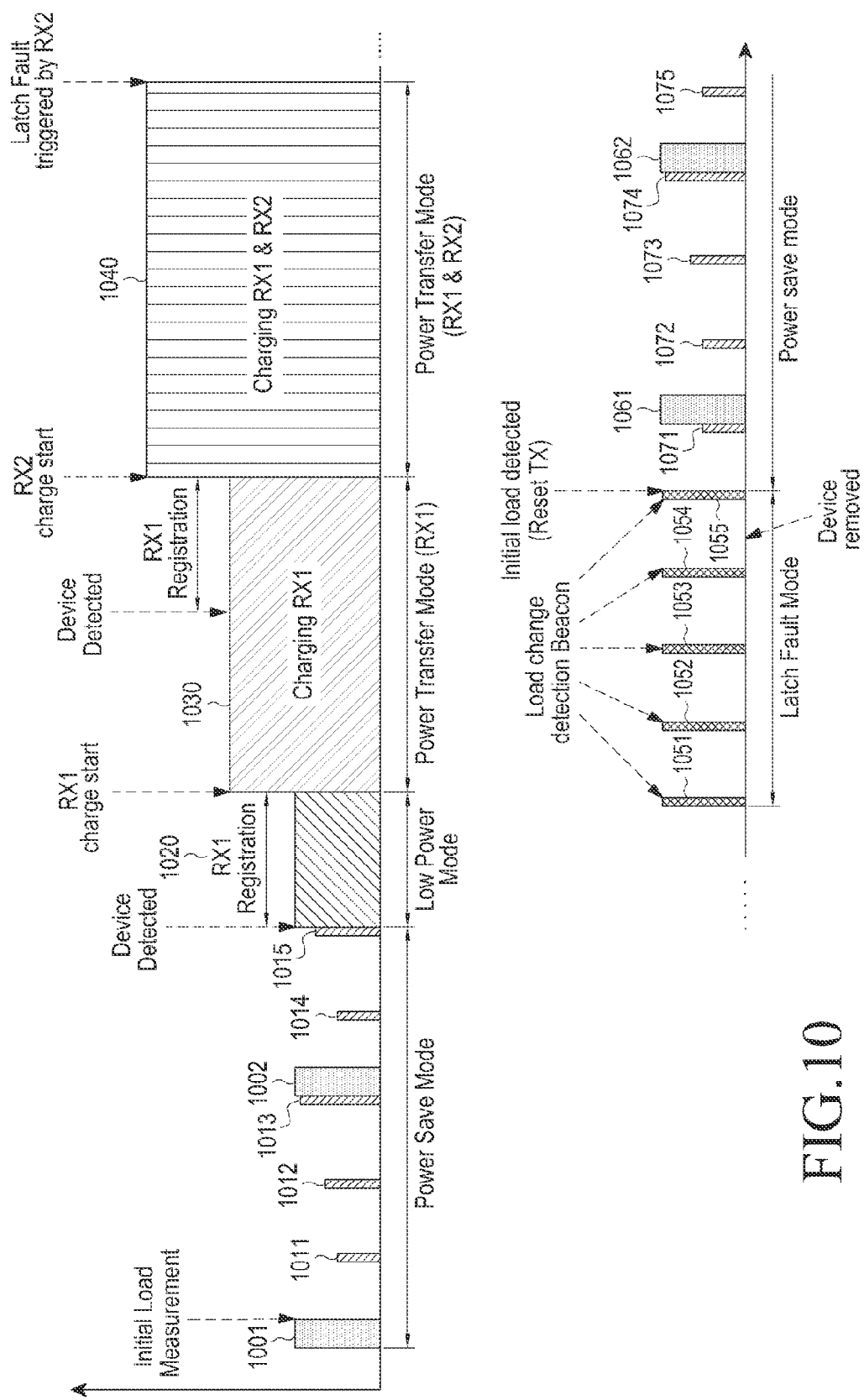
FIG. 10 is a graph illustrating amounts of power supplied by a wireless power transmitter with respect to a time axis according to FIG. 9.

FIG. 10 is a graph illustrating amounts of power applied by the wireless power transmitter with respect to a time axis, according to the embodiment of the present invention illustrated in FIG. 9.

Referring to FIG. 9, the wireless power transmitter transmits charging power to a first wireless power receiver, in step S901. The wireless power transmitter also transmits charging power to a second wireless power receiver, in step S905. More specifically, the wireless power transmitter applies the sum of charging power required for the first wireless power receiver and charging power required for the second wireless power receiver to power receivers of the first and second wireless power receivers.

An embodiment of steps S901 to S905 is illustrated in FIG. 10. For example, the wireless power transmitter maintains the power save mode in which the wireless power applies second detection power 1001 and 1002 and third detection power 1011 to 1015. Subsequently, the wireless power transmitter detects the first wireless power receiver and enters the low power mode in which the wireless power transmitter maintains detection power 1020. Then, the wireless power transmitter enters the power transfer mode in which the wireless power transmitter applies first charging power 1030. The wireless power transmitter detects the second wireless power receiver and allows the second wireless power receiver to join the wireless power network. In addition, the wireless power transmitter applies second charging power 1040 being the sum of charging power required for the first wireless power receiver and charging power required for the second wireless power receiver.

Referring to FIG. 9, while transmitting charging power to both the first and second wireless power receivers, in step S905, the wireless power transmitter detects an error, in step S907. As described above, the error may be due to the presence of a rogue object, cross connection, overvoltage, overcurrent, or overtemperature. If no error occurs, in step S907, e.g., NO, the wireless power transmitter continues to apply second charging power 1040.

In contrast, if an error occurs, in step S907, e.g. YES, the wireless power transmitter enters the latch fault mode, in step S909. For example, the wireless power transmitter applies first power 1051 to 1055 with a first period as illustrated in FIG. 10. The wireless power transmitter determines whether both the first and second wireless power receivers have been removed, in step S911. For example, the wireless power transmitter detects an impedance shift while applying the first power 1051 to 1055. The wireless power transmitter determines whether both the first and second wireless power receivers have been removed by checking whether an impedance has returned to an initial value.

If determining that both the first and second wireless power receivers have been removed, in step S911, e.g. YES, the wireless power transmitter enters the power save mode, in step S913. For example, the wireless power transmitter applies second detection power 1061 and 1062 and third detection power 1071 to 1075 respectively with second and third periods, as illustrated in FIG. 10.

As described above, even though the wireless power transmitter applies charging power to a plurality of wireless power receivers, upon an occurrence of an error, the wireless power transmitter may readily determine whether a wireless power receiver or a rogue object has been removed.

Figure 11:
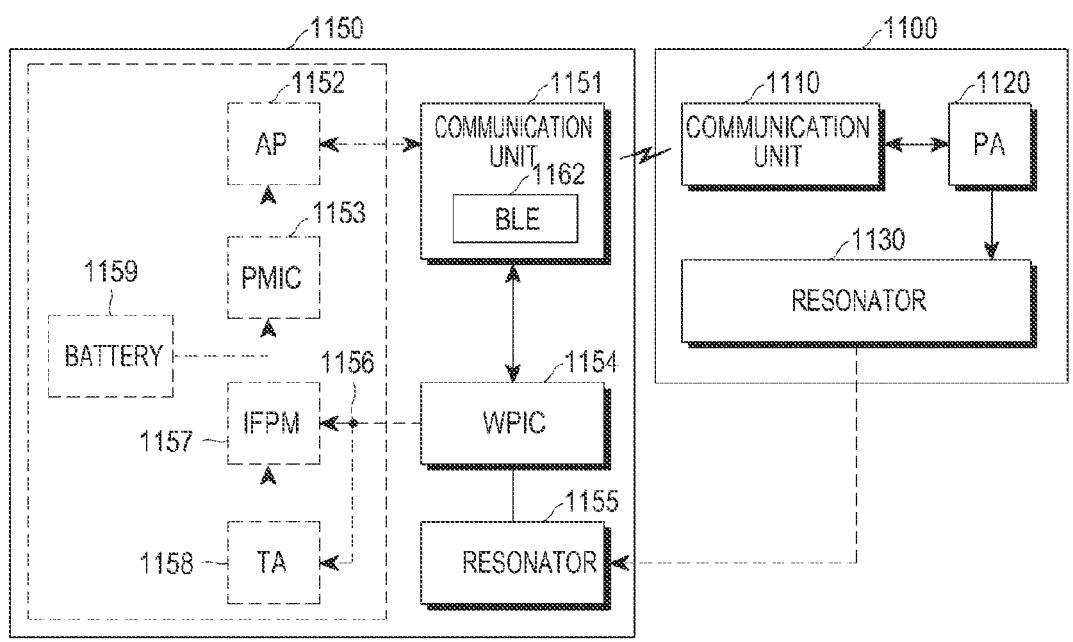
FIG. 11 is a block diagram illustrating a wireless power transmitter and a wireless power receiver in a Stand Alone (SA) mode, according to an embodiment of the present invention.

FIG. 11 is a block diagram of a wireless power transmitter and a wireless power receiver in the SA mode, according to an embodiment of the present invention.

Referring to FIG. 11, a wireless power transmitter 1100 includes a communication unit 1110, a PA 1120, and a resonator 1130. A wireless power receiver 1150 includes a communication unit 1151, an Application Processor (AP) 1152, a Power Management Integrated Circuit (PMIC) 1153, a Wireless Power Integrated Circuit (WPIC) 1154, a resonator 1155, an Interface Power Management IC (IFPM) 1157, a TA 1158, and a battery 1159.

The communication unit 1110 of the wireless power transmitter 1100 may be configured as a WiFi/BT combo IC and may communicate with the communication unit 1151 in the wireless power receiver 1150 in a predetermined communication scheme, for example, in BLE. For example, the communication unit 1151 of the wireless power receiver 1150 may transmit a PRU dynamic signal having the aforedescribed data structure illustrated in Table 1 to the communication unit 1110 of the wireless power transmitter 1100. As described above, the PRU dynamic signal may include at least one of voltage information, current information, and temperature information about the wireless power receiver 1150.

An output power value from the PA 1120 may be adjusted based on the received PRU dynamic signal. For example, if overvoltage, overcurrent, or overtemperature is applied to the wireless power receiver 1150, a power value output from the PA 1120 may be decreased. If the voltage or current of the wireless power receiver 1150 is below a predetermined value, the power value output from the PA 1120 may be increased.

Charging power from the resonator 1130 of the wireless power transmitter 1100 is transmitted wirelessly to the resonator 1155 of the wireless power receiver 1150.

The WPIC 1154 rectifies the charging power received from the resonator 1155 and performs DC/DC conversion on the rectified charging power. The WPIC 1154 drives the communication unit 1151 or charges the battery 1159 with the converted power.

A wired charging terminal may be inserted into the TA 1158. A wired charging terminal such as a 30-pin connector or a Universal Serial Bus (USB) connector may be inserted into the TA 1158. The TA 1158 may receive power from an external power source and charge the battery 1159 with the received power.

The IFPM 1157 processes the power received from the wired charging terminal and outputs the processed power to the battery 1159 and the PMIC 1153.

The PMIC 1153 manages power received wirelessly or wiredly and power applied to each component of the wireless power receiver 1150. The AP 1152 receives power information from the PMIC 1153 and controls the communication unit 1151 to transmit a PRU dynamic signal for reporting the power information.

A node 1156 connected to the WPIC 1154 is also connected to the TA 1158. If a wired charging connector is inserted into the TA 1158, a predetermined voltage, for example, 5V, may be applied to the node 1156. The WPIC 1154 determines whether the wired charging adaptor has been inserted by monitoring a voltage applied to the node 1156.

The AP 1152 has a stack of a predetermined communication scheme, for example, a WiFi/BT/BLE stack. Accordingly, for communication for wireless charging, the communication unit 1151 loads the stack from the AP 1152 and then communicates with the communication unit 1110 of the wireless power transmitter 1100, based on the stack, by BT/BLE.

However, it may occur that data for wireless power transmission cannot be retrieved from the AP 1152 due to power-off of the AP 1152 or there is insufficient power to maintain an ON state of the AP 1152 during retrieval of the data from a memory of the AP 1152 and usage of the retrieved data.

If the residual power amount of the battery 1159 is below a minimum power limit as described above, the AP 1152 is turned off and the battery 1159 is wirelessly charged using some components for wireless charging in the wireless power receiver 1150, for example, the communication unit 1151, the WPIC 1154, and the resonator 1155. A state in which power sufficient to turn on the AP 1152 cannot be supplied may be referred to as a dead battery state.

Because the AP 1152 is not operated in the dead battery state, the communication unit 1151 may not receive the stack of the predetermined communication scheme, for example, the WiFi/BT/BLE stack from the AP 1152. In anticipation of this case, a part of the stack of the predetermined communication scheme, for example, a BLE stack, is fetched from the AP 1152 and stored in a memory 1162 of the communication unit 1151. Accordingly, the communication unit 1151 may communicate with the wireless power transmitter 1100 using the stack of the communication scheme stored in the memory 1162, that is, a wireless charging protocol, for wireless charging. The communication unit 1151 may have an internal memory. The BLE stack may be stored in a Read Only Memory (ROM) in the SA mode. As described above, a mode in which the communication unit 1151 communicates using the stack of the communication scheme stored in the memory 1162 may be referred to as the SA mode. Accordingly, the communication unit 1151 may manage the charging procedure based on the BLE stack.

With reference to FIGS. 1 to 11, the concept of the wireless charging system applicable to the embodiments of the present disclosure has been described above. Now, methods for detecting a load according to embodiments of the present disclosure will be described in detail with reference to FIGS. 12 to 21.

Figure 12:
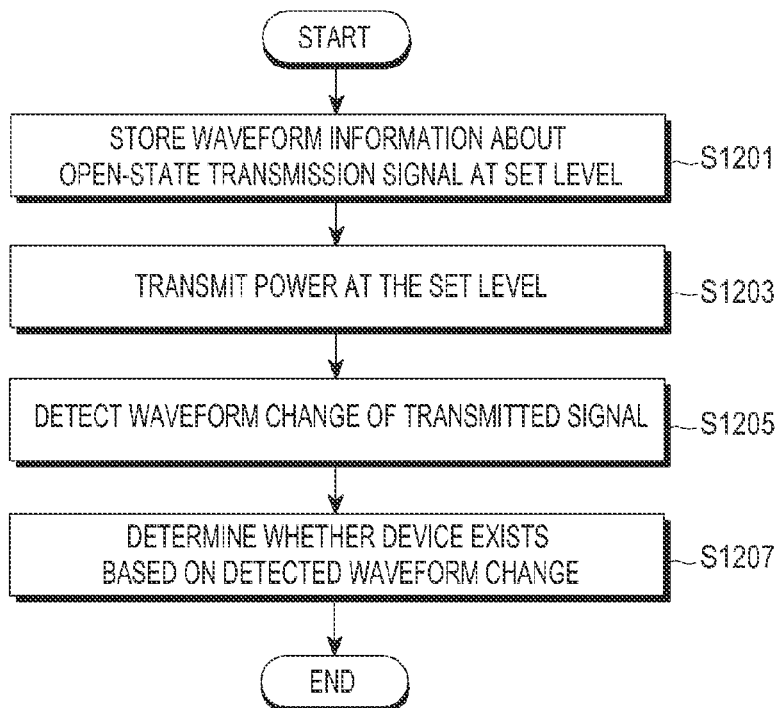
FIG. 12 is a flowchart illustrating a method for detecting a load in wireless charging, according to an embodiment of the present invention.

FIG. 12 is a flowchart illustrating a method for detecting a load in wireless charging, according to an embodiment of the present invention.

Referring to FIG. 12, a wireless power transmitter (e.g., wireless power transmitter 400) stores waveform information about a transmission signal in an open state at a predetermined transmission power level, at step S1201. The waveform information includes information about a current waveform Itx or voltage waveform Vtx of the transmission signal or information about a voltage waveform Vrect at an output end of a rectifier of a wireless power receiver (e.g., wireless power receiver 450). Or a reference level may be set for transmission power in the open state. Power may be transmitted at a current Itx level or voltage Vtx level based on the reference level.

The wireless power transmitter transmits a signal corresponding to the stored transmission signal waveform information to detect a wireless power receiver or an object for wireless charging, at step S1203. The transmission signal may be, for example, a short beacon signal or a long beacon signal.

If the wireless power transmitter transmits the signal in an open state in which no object or device is placed on the wireless power transmitter, a signal having the same waveform as, or a similar waveform to, a waveform corresponding to the stored waveform information may be detected by detecting the waveform of the transmitted signal.

On the other hand, if the wireless power transmitter transmits the signal while an object or device is located on or near to the wireless power transmitter, a waveform different from the waveform corresponding to the stored waveform information may be detected at least in a partial time interval.

For example, if a wireless power receiver or an object that may consume power (a power consumption object) is located on the wireless power transmitter, a capacitive element of the wireless power receiver or the power consumption object may consume power transmitted by the wireless power transmitter, thereby causing a change in the waveform of the transmitted power signal. The presence or absence, type, or proximity or remoteness of the object or wireless power receiver may be determined by detecting a waveform change of a power signal transmitted by the wireless power transmitter.

A change in the waveform of a current or voltage transmitted by the wireless power transmitter may be detected. If the detected current or voltage is different from an open-state current or voltage by a predetermined value or higher, it may be determined that a device exists.

A change in the waveform of a current or voltage transmitted by the wireless power transmitter may be detected. If the detected current or voltage is smaller or larger than an open-state current or voltage, it may be determined that a device is proximate to the wireless power transmitter.

As described before, power consumption of an internal capacitive element of a wireless power receiver or a power consumption object may cause a change in the voltage or current of a transmission signal Therefore, a change occurrence time of the voltage or current may be determined according to the size of the capacitive element. Thus, the wireless power transmitter may determine the presence or absence or the type of the wireless power receiver or the power consumption object based on the change occurrence time.

The wireless power transmitter detects the waveform of the transmission signal, at step S1205 and determines the presence or absence of a device based on the detected waveform at step S1207, as described above.

Figure 13:
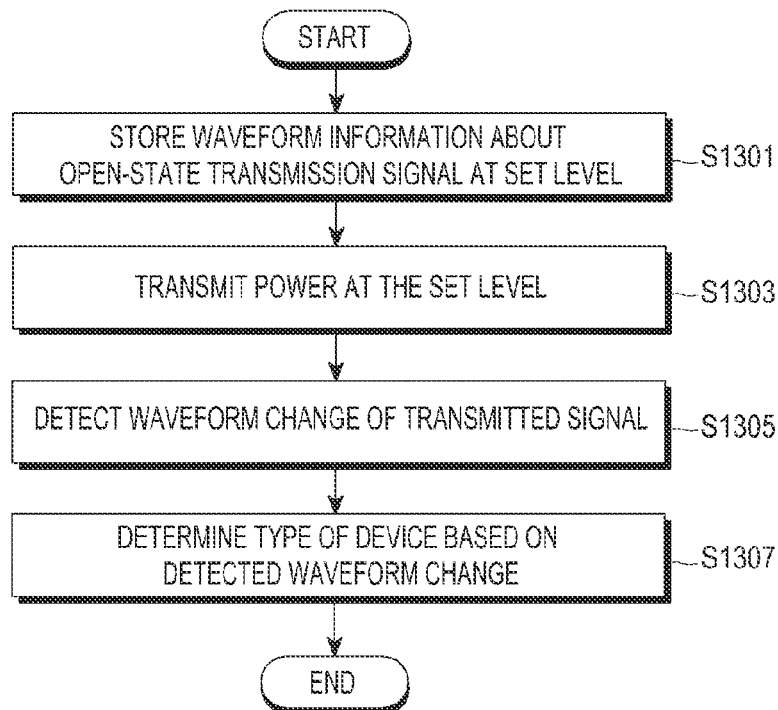
FIG. 13 is a flowchart illustrating a method for detecting a load in wireless charging, according to an embodiment of the present invention.

FIG. 13 is a flowchart illustrating a method for detecting a load in wireless charging, according to an embodiment of the present invention.

Referring to FIG. 13, a wireless power transmitter (e.g., wireless power transmitter 400) stores waveform information about a transmission signal in an open state at a predetermined transmission power level, at step S1301. The waveform information includes information about a current waveform Itx or voltage waveform Vtx of the transmission signal or information about a voltage waveform Vrect at an output end of a rectifier of a wireless power receiver (e.g., wireless power receiver 450).

The wireless power transmitter transmits a signal corresponding to the stored transmission signal waveform information to detect a wireless power receiver or an object for wireless charging, at step S1303. The transmission signal may be, for example, a short beacon signal or a long beacon signal.

The wireless power transmitter detects the waveform of the transmission signal, at step S1305 and determines the type of a device based on a change in the detected waveform at step S1307.

Figure 14:
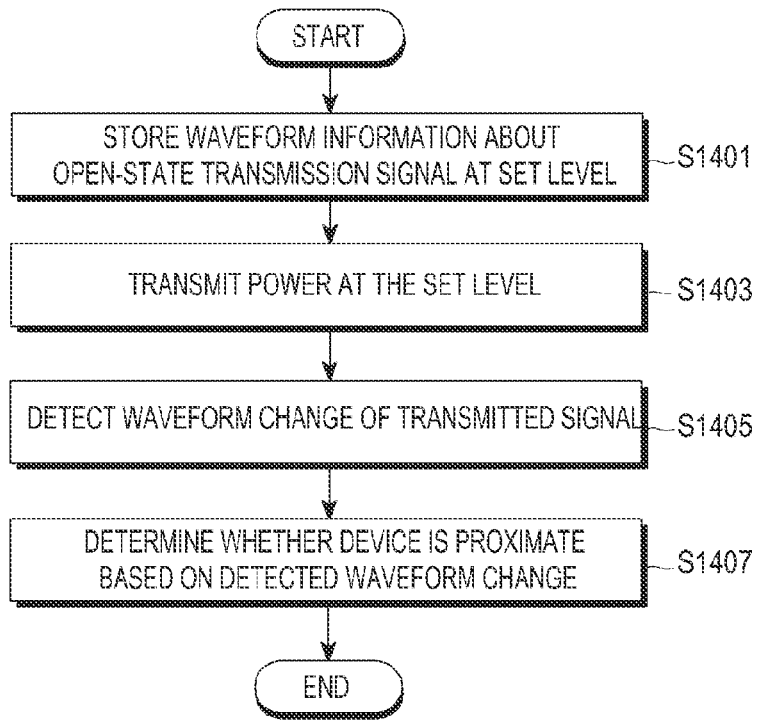
FIG. 14 is a flowchart illustrating a method for detecting a load in wireless charging, according to an embodiment of the present invention.

FIG. 14 is a flowchart illustrating a method for detecting a load in wireless charging, according to an embodiment of the present invention.

Referring to FIG. 14, a wireless power transmitter (e.g., wireless power transmitter 400) stores waveform information about a transmission signal in an open state at a predetermined transmission power level, at step S1401. The waveform information includes information about a current waveform Itx or voltage waveform Vtx of the transmission signal or information about a voltage waveform Vrect at an output end of a rectifier of a wireless power receiver (e.g., wireless power receiver 450).

The wireless power transmitter transmits a signal corresponding to the stored transmission signal waveform information to detect a wireless power receiver or an object for wireless charging, at step S1403. The transmission signal may be, for example, a short beacon signal or a long beacon signal.

The wireless power transmitter detects the waveform of the transmission signal, at step S1405 and determines whether a device is proximate to the wireless power transmitter based on a change in the detected waveform, at step S1407.

Figure 15:
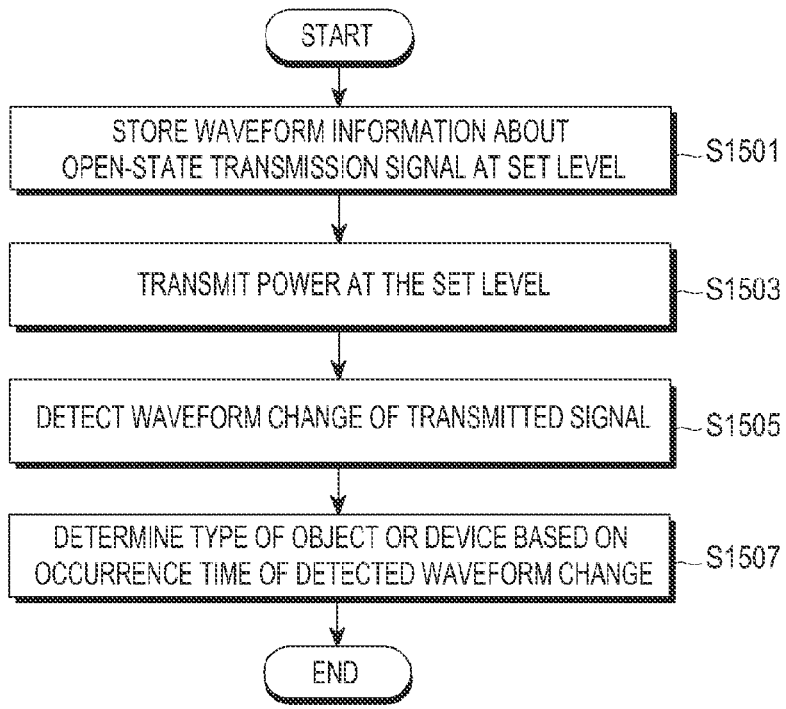
FIG. 15 is a flowchart illustrating a method for detecting a load in wireless charging, according to an embodiment of the present invention.

FIG. 15 is a flowchart illustrating a method for detecting a load in wireless charging, according to an embodiment of the present invention.

Referring to FIG. 15, a wireless power transmitter (e.g., (e.g., wireless power transmitter 400) stores waveform information about a transmission signal in an open state with respect to a predetermined transmission power level, at step S1501. The waveform information includes information about a current waveform Itx or voltage waveform Vtx of the transmission signal or information about a voltage waveform Vrect at an output end of a rectifier of a wireless power receiver (e.g., wireless power receiver 450).

The wireless power transmitter transmits a signal corresponding to the stored transmission signal waveform information to detect a wireless power receiver or an object for wireless charging, at step S1503. The transmission signal may be, for example, a short beacon signal or a long beacon signal.

The wireless power transmitter detects the waveform of the transmission signal, at step S1505 and determines whether a device is near to the wireless power transmitter based on a change occurrence time of the detected waveform, at step S1507.

With reference to FIGS. 16-21, examples of detecting an object or device according to the afore-described waveform change are described.

FIGS. 16-21 are graphs illustrating waveforms of a transmission signal in an open state, according to an embodiment of the present invention.

Figure 16:
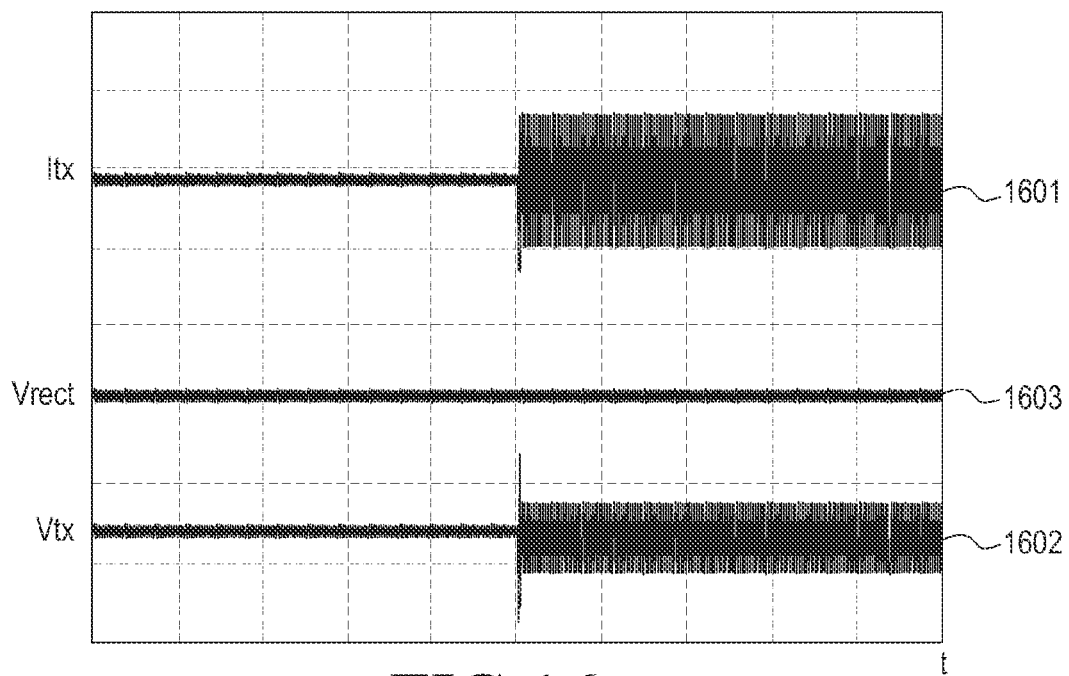
FIG. 16 is a graph illustrating transmission signal waveforms in an open state, according to an embodiment of the present invention.
Figure 17:
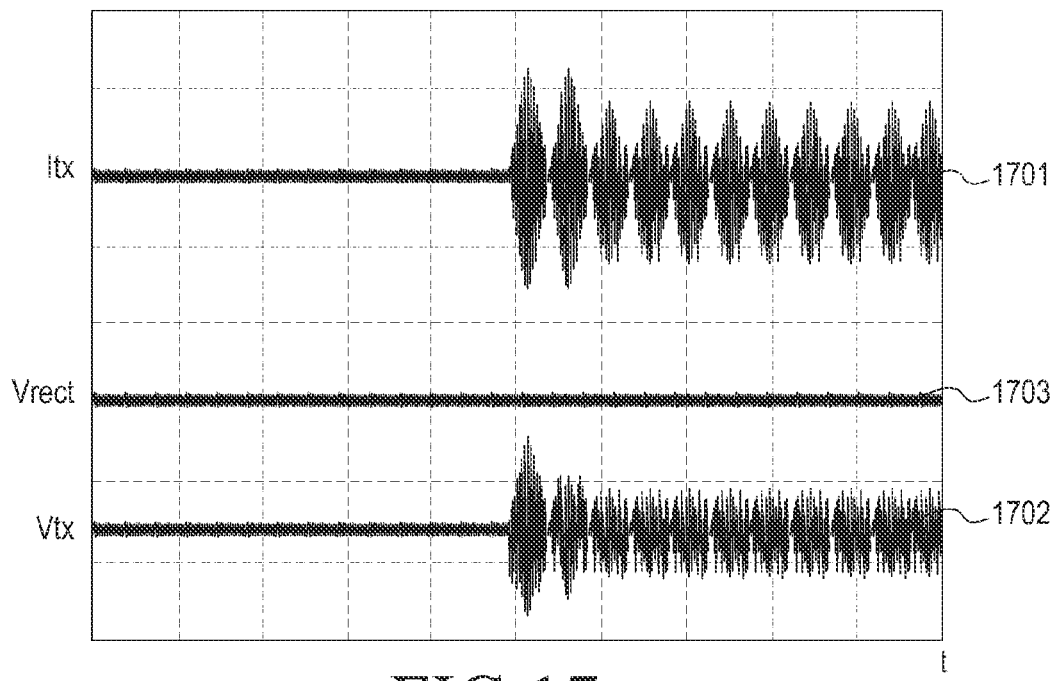
FIG. 17 is a graph illustrating transmission signal waveforms in an open state, according to an embodiment of the present invention.

Referring to FIGS. 16 and 17, when power is transmitted at a predetermined level at time t in an open state, the illustrated waveforms may be detected. The waveforms may be current waveforms Itx 1601 and 1701 or voltage waveforms Vtx 1602 and 1702. Open-state waveform information may be stored in a memory of a wireless power transmitter.

Because no object or device is placed on the wireless power transmitter in the open state, voltage waveforms Vrect 1603 and 1703 at the output end of a rectifier of a wireless power receiver may take the forms illustrated in FIGS. 16 and 17.

FIG. 16 illustrates rectangular pulses Itx and Vrect with 6.78-MHz sinusoidal waves in a wireless power transmitter.

Figure 18:
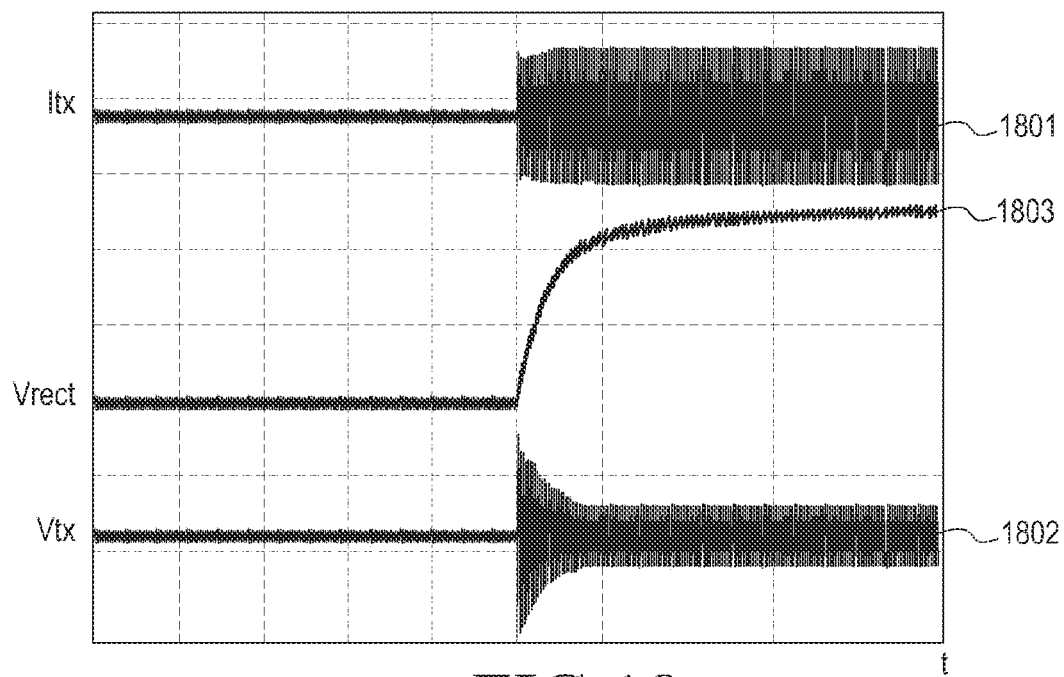
FIG. 18 is a graph illustrating transmission signal waveforms in the presence of a load, according to an embodiment of the present invention.
Figure 19:
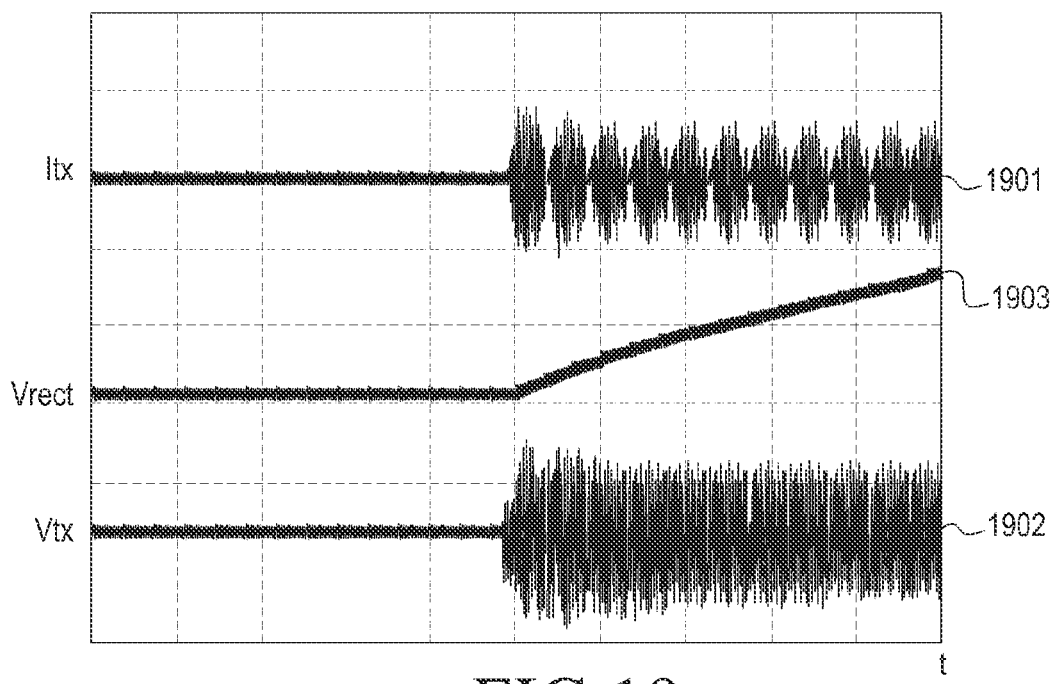
FIG. 19 is a graph illustrating transmission signal waveforms in the presence of a load, according to an embodiment of the present invention.

FIGS. 18 and 19 illustrate graphs illustrating waveforms of a transmission signal in the presence of a load, according to an embodiment of the present invention. If a wireless power transmitter transmits open-state power, as illustrated in FIGS. 16 and 17, in the presence of a wireless power receiver, the waveform of the transmitted signal may be changed at its transmission time point, as illustrated in FIGS. 18 and 19.

For example, if a load (for example, an object or device) exists, the open-state current waveform Itx 1601 or voltage waveform Vtx 1602 may be changed to a current waveform Itx 1801 or voltage waveform Vtx 1802, as illustrated in FIG. 18.

If a load (for example, an object or device) exists, the open-state current waveform Itx 1701 or voltage waveform Vtx 1702 may be changed to a current waveform Itx 1901 or voltage waveform Vtx 1902, as illustrated in FIG. 19.

Referring to FIGS. 18 and 19, because a load such as a wireless power receiver is placed on a wireless power transmitter, voltage waveforms 1803 and 1903 at the output end of a rectifier in a wireless power receiver may have ramp-up.

Figure 20:
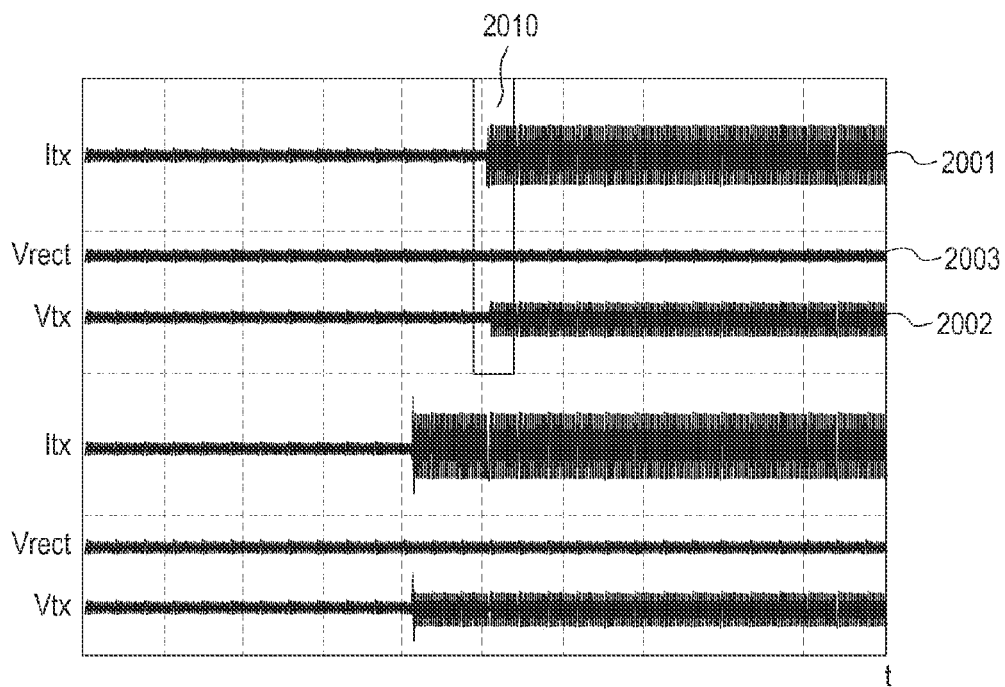
FIG. 20 is a graph illustrating transmission signal waveforms in an open state, according to an embodiment of the present invention.
Figure 21:
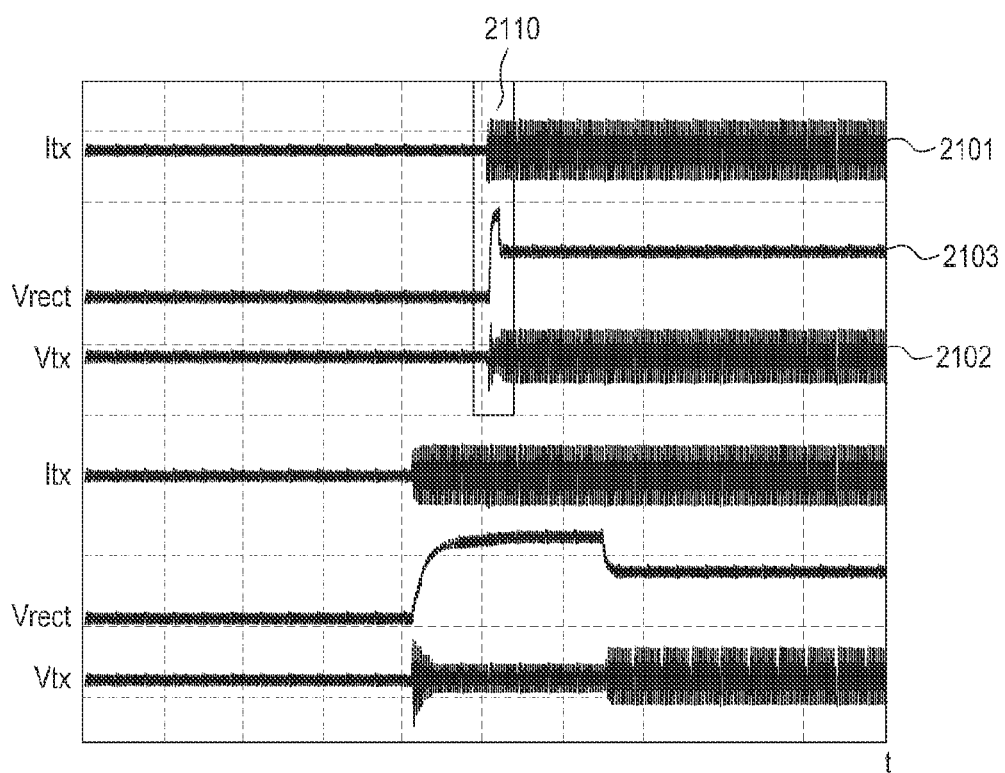
FIG. 21 is a graph illustrating transmission signal waveforms in the presence of a load, according to an embodiment of the present invention.

FIGS. 20 and 21 are graphs illustrating sensing of a change in a specific time interval of signal transmission. FIG. 20 is a graph illustrating waveforms of a transmission signal in an open state, according to an embodiment of the present invention and FIG. 21 is a graph illustrating waveforms of a transmission signal in the presence of a load, according to an embodiment of the present invention.

For example, the waveforms illustrated in FIGS. 16 and 18 in a specific time interval may be enlarged to the waveforms illustrated in FIGS. 20 and 21, respectively.

Referring to FIG. 20, an upper graph illustrating a current waveform Itx 2001, a voltage waveform Vtx 2002, and a voltage waveform Vrect 2003 at the output end of a rectifier may be enlarged to a lower graph, in a predetermined time interval 2010 spanning before and after a transmission time of a signal. Also, referring to FIG. 21, an upper graph illustrating a current waveform Itx 2101, a voltage waveform Vtx 2102, and a voltage waveform Vrect 2103 at the output end of a rectifier may be enlarged to a lower graph, in a predetermined time interval 2110 spanning before and after a transmission time of a signal.

The wireless power transmitter determines the presence or absence of a load, the type of the load, or proximity or remoteness of the load by detecting a change in a signal (for example, a short beacon signal) during a time interval before and after a transmission time of the signal.

The wireless power transmitter determines the presence or absence of a load, the type of the load, or proximity or remoteness of the load based on a time at which the change occurs.

Further, a waveform change may be sensed by sensing a change in a predetermined waveform (for example, a rectangular waveform) or by determining whether a current or voltage variation is equal to or larger than a predetermined range, with respect to a current or voltage in an open state.

The wireless power transmitter determines the presence or absence of a device by comparing a pre-stored transmission signal waveform with the waveform of a signal being transmitted.

The wireless power transmitter determines the type of a device by comparing a pre-stored transmission signal waveform with the waveform of a signal being transmitted.

The wireless power transmitter determines proximity or remoteness of a device by comparing a pre-stored transmission signal waveform with the waveform of a signal being transmitted.

The wireless power transmitter determines a type of a device or object by comparing a pre-stored transmission signal waveform with the waveform of a signal being transmitted and determining a time at which the waveform has been changed.

While the present invention has been shown and described with reference to certain embodiments thereof, it should be understood by those skilled in the art that many variations and modifications of the method and apparatus described herein will still fall within the spirit and scope of the present invention as defined by the appended claims and their equivalents.

What is claimed is:

1. A method for detecting a device in wireless charging, the method comprising:
   storing waveform information of a first power to be transmitted for detecting the device;
   generating the first power for detecting the device;
   sensing a second power being transmitted according to the generation of the first power; and
   detecting a device based at least in part on comparison of a waveform of the sensed second power and the stored waveform information of the first power.

2. The method of claim 1, wherein the waveform information is waveform information relating to a current of the first power to be transmitted.

3. The method of claim 1, wherein the waveform information is waveform information relating to a voltage of the first power to be transmitted.

4. The method of claim 1, wherein the waveform information is waveform information relating to an open state without any load.

5. The method of claim 1, wherein detecting the device comprises detecting a ramp-up of the sensed second power within a predetermined time interval.

6. The method of claim 5, wherein the ramp-up occurs within a predetermined time interval that corresponds to a transmission time of the second power transmitted according to the first power.

7. The method of claim 5, wherein the ramp-up occurs by charging a capacitive element of a wireless power receiver.

8. The method of claim 5, wherein if the ramp-up is detected within the predetermined time interval, it is determined that at least one wireless power receiver is located within a charging area.

9. The method of claim 1, further comprising determining a type of the device based on the comparison.

10. The method of claim 1, further comprising determining whether the device is proximate to a charging area based on the comparison.

11. A wireless power transmitter for detecting a device in wireless charging, the wireless power transmitter comprising:
   a memory to store waveform information of a first power to be transmitted for detecting the device;
   a controller configured to:
   generate the first power for detecting the device;
sense a second power being transmitted according to the generation of the first power; and
   detect a device based at least in part on comparison of a waveform of the sensed second power and the stored waveform information of the first power.

12. The wireless power transmitter of claim 11, wherein the waveform information is waveform information relating to a current of the first power to be transmitted.

13. The wireless power transmitter of claim 11, wherein the waveform information is waveform information relating to a voltage of the first power to be transmitted.

14. The wireless power transmitter of claim 11, wherein the waveform information is waveform information relating to an open state without any load.

15. The wireless power transmitter of claim 11, wherein the controller is further configured to detect a ramp-up of the sensed second power within a predetermined time interval the device by charging a capacitive element of a wireless power receiver.

16. The wireless power transmitter of claim 11, wherein the controller is further configured to determine a type of the device based on the comparison.

17. The wireless power transmitter of claim 16, wherein the controller is further configured to determine the type of the device based on a category of a wireless power receiver.

18. The wireless power transmitter of claim 11, wherein the controller is further configured to determine whether a device is located proximate to a charging area based on the comparison.

19. The wireless power transmitter of claim 18, wherein it is determined whether the device is proximate to the charging area based on whether the waveform of the sensed second power falls or rises relative to a waveform in an open state.

20. The wireless power transmitter of claim 11, wherein the first power to be transmitted is a short beacon power.

\* \* \* \* \*

UNITED STATES PATENT AND TRADEMARK OFFICE
CERTIFICATE OF CORRECTION

| | |
|---|---|
| PATENT NO. | : 9,853,481 B2 |
| APPLICATION NO. | : 14/626500 |
| DATED | : December 26, 2017 |
| INVENTOR(S) | : Kyung-Woo Lee et al. |

It is certified that error appears in the above-identified patent and that said Letters Patent is hereby corrected as shown below:

On the Title Page

Item (54) and in the Specification, Column 1, delete:
"METHOD FOR DETECTING LOAD IN WIRELESS CHARGING PRIORITY"
And insert:
-- METHOD FOR DETECTING LOAD IN WIRELESS CHARGING --

Signed and Sealed this
Twenty-ninth Day of May, 2018

Andrei Iancu
*Director of the United States Patent and Trademark Office*